(12) United States Patent
Kirsch

(10) Patent No.: US 6,621,316 B1
(45) Date of Patent: Sep. 16, 2003

(54) SYNCHRONOUS MIRROR DELAY (SMD) CIRCUIT AND METHOD INCLUDING A COUNTER AND REDUCED SIZE BI-DIRECTIONAL DELAY LINE

(75) Inventor: Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/176,865

(22) Filed: Jun. 20, 2002

(51) Int. Cl.[7] ............................ H03L 7/00; H03H 11/26
(52) U.S. Cl. ....................... 327/161; 327/158; 327/276
(58) Field of Search ................................ 327/161, 155, 327/158, 159, 160, 276, 277; 365/233

(56) References Cited

U.S. PATENT DOCUMENTS

| | | | | |
|---|---|---|---|---|
| 4,965,810 | A | 10/1990 | Peischl et al. | 375/80 |
| 5,077,686 | A | 12/1991 | Rubinstein | 395/550 |
| 5,233,316 | A | 8/1993 | Yamada et al. | 331/45 |
| 5,574,508 | A | 11/1996 | Diamant | 348/511 |
| 5,757,218 | A | 5/1998 | Blum | 327/175 |
| 5,910,740 | A | 6/1999 | Underwood | 327/149 |
| 5,946,244 | A | 8/1999 | Manning | 365/194 |
| 5,955,905 | A | 9/1999 | Idei et al. | 327/160 |
| 6,069,508 | A | * 5/2000 | Takai | 327/161 |
| 6,107,891 | A | 8/2000 | Coy | 331/18 |
| 6,239,641 | B1 | 5/2001 | Lee | 327/270 |
| 6,240,042 | B1 | 5/2001 | Li | 365/233 |
| 6,304,117 | B1 | 10/2001 | Yamazaki et al. | 327/158 |
| 6,330,197 | B1 | 12/2001 | Currin et al. | 365/194 |
| 6,373,307 | B1 | * 4/2002 | Takai | 327/161 |
| 6,378,079 | B1 | 4/2002 | Mullarkey | 713/401 |
| 6,404,248 | B1 | 6/2002 | Yoneda | 327/158 |
| 6,480,047 | B2 | 11/2002 | Abdel-Maguid et al. | 327/161 |
| 6,484,268 | B2 | 11/2002 | Tamura et al. | 713/600 |

OTHER PUBLICATIONS

Patent Application Publication, 0180499, Kim et a Dec. 2, 2002.*

Patent Application Publication, 0176315, Graaff Nov. 28, 2002.*

Chae, Jeong–Seok et al., "Wide Range Single–Way–Pumping Synchronous Mirror Delay", IEEE Electronics Letter Online No. 20000711, Feb. 11, 2000, pp. 939–940.

Jang, Seong–Jin et al., A Compact Ring Delay Line for High Speed Synchronous DRAM, IEEE Symposium on VLSI Circuits Digest of Technical Papers, 1998, pp. 60–61.

Kuge, Shigehiro et al., "A 0.18μm 256Mb DDR–SDRAM with Low–Cost Post Mold–Tuning Method for DLL Replica", IEEE International Solid–State Circuits Conference, Feb. 2000, pp. 402–403.

Saeki, Takanori et al., "A 2.5ns Clock Access 250MHz 256Mb SDRAM with a Sychronous Mirror Delay", IEEE International Solid–State Circuits Conference, Feb. 1996, pp. 374–375.

Takai, Yasuhiro et al., A 250Mb/s/pin 1Gb Double Data Rate SDRAM with a Bi–Directional Delay and an Inter–Bank Shared Redundancy Scheme, 1999.

* cited by examiner

*Primary Examiner*—Tuan T. Lam
(74) *Attorney, Agent, or Firm*—Dorsey & Whitney LLP

(57) ABSTRACT

A synchronous mirror delay (SMD) includes a model delay line that is coupled to a bi-directional delay line. In operation, an initial edge an input clock signal is applied through the model delay line to the bi-directional delay line. The SMD thereafter operates in a forward delay mode to alternately operate the bi-directional delay line in a forward mode and a backward mode to propagate the initial edge of the input clock signal through the bi-directional delay line and delay the initial edge of the input clock signal by a forward delay. In response to a subsequent edge of the input clock signal, the SMD mirrors the propagation of the input clock signal through the bi-directional delay line during the forward mode and further delay the initial edge of the input clock signal by a backward delay that is substantially equal to the forward delay.

48 Claims, 16 Drawing Sheets

SYNCHRONOUS MIRROR DELAY (SMD) CIRCUIT AND METHOD INCLUDING A COUNTER AND REDUCED SIZE BI-DIRECTIONAL DELAY LINE

TECHNICAL FIELD

The present invention relates generally to integrated circuits, and more specifically to synchronizing internal clocking signals generated in an integrated circuit with external clocking signals applied to the integrated circuit.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands.

In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modern synchronous memories the frequency is in excess of 100 MHZ. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram of a conventional SMD 100 that receives an applied clock signal CLK and generates a synchronized clock signal CLKSYNC in response to the CLK signal, the CLKSYNC signal being synchronized with the CLK signal. The SMD 100 includes an input buffer 102 that receives the CLK signal and generates a buffered clock signal CLKBUF in response to the CLK signal. The CLKBUF signal has a delay D1 relative to the CLK signal, where D1 corresponds to the inherent propagation delay of the input buffer.

A model delay line 104 receives the CLKBUF signal and generates a forward delayed clock signal FDCLK having a model delay D1+D2 relative to the CLKBUF signal. The model delays D1 and D2 simulate the delay D1 introduced by the input buffer 102 and a delay D2 introduced by an output buffer 106 that generates the CLKSYNC signal, as will be explained in more detail below. The FDCLK signal propagates through a forward delay line 108 including a plurality of unit delays 110A-N coupled in series, each unit delay receiving an input signal from the prior unit delay and generating an output signal having a unit delay UD relative to the input signal. Each unit delay 110A-N may, for example, be an inverter as indicated for the unit delay 110A, with the inverter introducing the unit delay UD corresponding to the propagation delay of the inverter. In the forward delay line 104, the FDCLK signal propagates through the unit delays 110A-N from left to right in FIG. 1, as indicated by the orientation of the inverter in the unit delay 110A. The forward delay line 108 includes a plurality of outputs 112A-N, each output 112A-N being coupled to the output from the corresponding unit delay 110A-N, respectively. As the FDCLK signal propagates through the unit delays 110A-N, when the signal is present on a respective output 112A-N the signal is designated a delayed forward clock signal DFDCLK.

A backward delay line 114 includes a plurality of unit delays 116A-N coupled in series as previously described for the forward delay line 108. Instead of providing the outputs from the unit delays 116A-N as with the forward delay line 108, however, the backward delay line 114 has a plurality of inputs 118A-N, each input being coupled to the input of the corresponding unit delay 116A-N, respectively. A mirror controller 120 is coupled to the outputs 112A-N of the forward delay line 108 and the inputs 118A-N of the backward delay line 114. In response to rising-edges of the CLKBUF signal, the mirror controller 120 applies the DFDCLK signal from the corresponding unit delay 110A-N in the forward delay line 108 to the input of the corresponding unit delay 116A-N in the backward delay line 114. For example, if the FDCLK signal has propagated to the output of the unit delay 110J, the mirror controller 120 outputs the DFDCLK signal on the output of the unit delay 110J to the input of the unit delay 116J in the-backward delay line 114. The DFDCLK signal propagates through the corresponding unit delay 116A-N in the backward delay line 114 and through all unit delays to the left of that unit delay, and is output from the backward delay line 114 as a delayed clock signal CLKDEL. Thus, in the backward delay line 114, DFDCLK signal propagates through the unit delays 116A-N from right to left in FIG. 1, as indicated by the orientation of the inverter in the unit delay 116A. The output buffer 106 receives the CLKDEL signal and generates the CLKSYNC in response to the CLKDEL signal, with the CLKSYNC being delayed by the delay D2 introduced by the output buffer. As illustrated by a dotted line in FIG. 1, the output buffer 106 may correspond to a data driver that receives a data signal DQX and outputs the data signal in response to being clocked by the CLKDEL signal, as will be appreciated by those skilled in the art.

The overall operation of the SMD 100 in synchronizing the CLKSYNC signal with the CLK signal will now be described in more detail with reference to FIG. 1 and a signal timing diagram of FIG. 2 illustrating various signals generated by the SMD during operation. In the example of FIG. 2, an initial rising-edge of the CLK signal occurs at a time T0. In response to the rising-edge of the CLK signal at the time T0, the input buffer 102 drives the CLKBUF signal high the delay D1 later at a time T1, with this initial rising-edge of the CLKBUF signal being designated the N edge of the CLKBUF signal. In response to the rising-edge transition of the CLKBUF signal at the time T1, the mode delay line 104 drives the FDCLK signal high the model delay D1+D2 later at a time T2. The FDCLK signal thereafter propagates through the unit delays 110A-N in the forward delay line 108 until a next rising-edge N+1 of the CLKBUF signal is applied to the mirror controller 120 at a time T3. At the time T3, the forward delay line 108 has delayed the FDCLK signal by a forward delay FD that equals TCK-(D1+D2) where TCK is the period of the CLK signal. This is true because, as illustrated in FIG. 2, the next rising-edge of the CLKBUF signal occurs TCK-(D1+D2) after the initial rising-edge of the FDCLK signal at the time T2.

In response to the rising-edge of the CLKBUF signal at the time T3, the mirror controller 120 applies the FDCLK signal from the output of the appropriate unit delay 110A-N in the forward delay line 108 to the corresponding input 118A-N of the backward delay line 114. For example, assume that the delay TCK-(D1+D2) equals eleven unit delays UD so that the mirror controller 120 receives the DFDCLK signal from the output 112K of the unit delay 110K in the forward delay line 108. In this situation, the mirror controller 120 applies the DFDCLK signal to the input 118K of the unit delay 116K in the backward delay line 114. This is illustrated in FIG. 2 as a rising-edge of the DFDCLK signal at the time T3.

The DFDCLK signal thereafter propagates through the appropriate unit delays 116A-N in the backward delay line 114, and at a time T4 the backward delay line 114 drives the CLKDEL signal high in response to the applied DFDCLK signal. At the time T4, the backward delay line 114 has delayed the DFDCLK signal by a backward delay BD that equals TCK-(D1+D2) which equals the forward delay FD of the forward delay line 108. This is true because the DFDCLK signal propagates through the same number of unit delays 116A-N in the backward delay line 114 as did the FDCLK signal to the unit delays 110A-N in the forward delay line 108, as will be appreciated by those skilled in the art. The total delay of the CLKDEL signal at the time T4 equals D1+D1+D2+TCK-(D1+D2)+TCK-(D1+D2), which equals 2TCK-D2. Thus, the rising-edge of the CLKDEL signal at the time T4 occurs the delay D2 of the output buffer 106 before a next rising-edge of the CLK signal at a time T5. In response to the CLKDEL signal at the time T4, the output buffer 106 drives the CLKSYNC signal high at the time T5 and in synchronism with the rising-edge of the CLK signal. In this way, the SMD 100 generates the CLKSYNC signal having rising-edges that are synchronized with the rising-edges of the CLK signal.

In the SMD 100, although the input buffer 102 and output buffer 106 are illustrated as single components, each represents all components and the associated delays between the input and output of the SMD 100. The input buffer 106 thus represents the delay D1 of all components between an input that receives the CLK signal and the input to the model delay line 104, and the output buffer 106 represents the delay D2 of all components between the output of the backward delay line 114 and an output at which the CLKSYNC signal is developed, as will be appreciated by those skilled in the art.

In SMD 100, the forward and backward delay lines 108, 114 each include the same number of unit delays 110A-N, 116A-N. A large number of unit delays 110A-N, 116A-N is desirable to provide the SMD 100 with better resolution in generating the forward and backward delays FD, BD, which hereinafter will collectively be referred to as a variable delay VD (i.e., VD=FD+BD). The resolution of the SMD 100 is the smallest increment of delay that can be added and subtracted from the variable delay VD, which equals twice the unit delay UD of the unit delays 110A-N, 116A-N in the SMD 100. Better resolution means the CLK and CLKSYNC signals will be properly synchronized, as will be appreciated by those skilled in the art. In addition, the forward and backward delay lines 108, 114 must be able to collectively provide a maximum variable delay VD corresponding to the CLK signal having the lowest frequency in the frequency range over which the SMD 100 is designed to operate. This is true because the forward and backward delay lines 108, 114 must each provide a delay of TCK-(D1+D2), which will have its largest value when the period TCK of the CLK signal is greatest, which occurs at the lowest frequency of the CLK signal.

One approach that has been utilized to reduce the size and power consumed by the delay lines 108, 114 is illustrated in FIG. 3 which depicts an SMD 300 including a bi-directional delay line 302 for generating the required delay to synchronize a synchronized clock signal CLKSYNC with an applied clock signal CLK. The SMD 300 includes an input buffer 304, a delay line 306, and output buffer 308 that operate in the same way as previously described for the corresponding components in the SMD 100 of FIG. 1, and thus, for the sake of brevity, these components will not again be described in detail. The bi-directional delay line 302 includes a plurality of unit delays 310A-N that operate in a forward delay mode to receive a forward delayed clock signal FDCLK from the model delay line 306 and to sequentially delay this signal by a unit delay TPD as the signal propagates through each unit delay in a forward direction (left to right in FIG. 3). The FDCLK signal continues propagating through the unit delays 310A-N in the forward direction until a reflection signal REF is received from a control circuit 312. In response to the REF signal, the bi-directional delay line 302 commences operation in a backward delay mode and reverses the direction of the propagating FDCLK signal, which begins propagating through the unit delays 310A-N in a backward direction (right to left in FIG. 3). Once again, as the FDCLK signal propagates through the unit delays 310A-N in the backward direction each unit delay delays the signal by the unit delay TPD until the signal is output from the unit delay 310A as a delayed clock signal CLKDEL. The FDCLK signal propagates through the same number of unit delays 310A-N in the forward and backward delay modes.

In operation, an initial rising edge of the CLK signal propagates through the input buffer 304 and the model delay line 306 to generate an initial rising edge of the FDCLK signal that is input to the unit delay 310A of the bi-directional delay line 302. In the following description, the edge of the FDCLK signal that is propagating through the bi-directional delay line 302 may simply be referred to as the FDCLK signal propagating through the bi-directional delay line for ease of description. The FDCLK signal continues propagating through the unit delays 310A–N in the forward direction until a subsequent rising edge of the CLKBUF signal from the input buffer 304 is applied to the control circuit 312. In response to the subsequent rising edge of the CLKBUF signal, the control circuit 312 applies an active REF signal to the bi-directional delay line 302 which, in turn, commences operation in the backward mode in response to the REF signal. Note that at this point, as indicated in FIG. 3, the delay introduced by the bi-directional delay line 302 equals a forward delay FD that is equal to TCK-(D1+D2). The FDCLK signal thereafter propagates through the unit delays 310A–N in the backward direction until the signal is output from the unit delay 310A as the CLKDEL signal. The bi-directional delay line 302 delays the FDCLK signal in the backward direction by a backward delay BD which approximately equals the forward delay FD of TCK-(D1+D2). In response to the CLKDEL signal, the output buffer 308 generates the CLKSYNC signal that is synchronized with the CLK signal. More specifically, in the simplified embodiment of FIG. 3 alternate rising edges of the CLKSYNC signal are synchronized with corresponding rising edges of the CLK signal.

FIG. 4 illustrates one embodiment of the bi-directional delay line 302 of FIG. 3 and illustrates the unit delays 310A–N in more detail. Each unit delay 310A–N includes a first group of the PMOS and NMOS transistors 402–408 connected in series and connected to a second group of the PMOS and NMOS transistors 410–416 the connected in series, as illustrated. The PMOS transistors 402 and NMOS transistors 408 in each unit delay 310A–N receive a forward control signal FWD while the PMOS transistors 410 and NMOS transistors 416 receive a backward control signal BWD. The FWD and BWD signals are active high and are complementary signals, meaning that when the FWD signal is high the BWD signal is low and when the BWD signal is high the FWD signal is low. In each unit delay 310A–N, the transistor 406 receives a forward input signal FA-FN−1 from a forward output node 418 of the preceding unit delay, with the unit delay 310A receiving the FDCLK signal as the forward input signal applied to the transistor 406. In addition, each transistor 414 in the unit delays 310A–N receives a backward input signal BB-BN+1 from a backward output node 420 of the subsequent unit delay, with the backward output node 420 of the unit delay 310A providing the CLKDEL signal. In addition, in the final unit delay 310N the forward output node 418 may be coupled to the gate of the transistor 414 to apply the forward input signal FN as the backward input signal BN+1 in the unit delay 310N.

The operation of the bi-directional delay line 302 of FIG. 4 will now be described in more detail with reference to a signal timing diagram of FIG. 5 that illustrates various signals in the bi-directional delay line during operation in the forward and backward modes. Prior to commencing operation of bi-directional delay line 302 in delaying the FDCLK signal, the delay line operates in an initialization mode to precharge various signals to desired values. To place the bi-directional delay line 302 in the initialization mode, the control circuit 312 (FIG. 3) drives the BWD signal active high, drives the FWD signal inactive low, and applies a high backward input signal BN+1 to the final unit delay 310N. In response to these signals, the bi-directional delay line 302 precharges the nodes 420 and thereby the CLKDEL and BB-BN signals high and the nodes 418 and thereby the FA-FN−1 signals low, as will now be described in more detail. In the following description, the BB-BN and FA-FN−1 signals will be described as being precharged either high or low, which means the corresponding nodes 418, 420 are either being charged or discharged to drive the corresponding BB-BN and FA-FN−1 signals to the desired voltage level, as will be appreciated by those skilled in the art.

During the initialization mode, in response to the active high BWD signal, the transistors 410 and 416 in each unit delay 310A–N turn OFF and ON, respectively, and in response to the inactive low FWD signal the transistors 402 and 408 turn ON and OFF, respectively. Starting with the unit delay 310N, the high BN+1 signal turns ON the transistor 414 which, in turn, precharges the FN signal low and turns ON the transistor 404. The transistors 402, 404 are now both turned ON, precharging the BN signal high. In response to the high BN signal, the transistor 414 in the unit delay 310N−1 (not shown) turns ON. At this point, the transistors 414 and 416 in the unit delay 310N−1 are both turned ON, precharging the FN−1 signal low. This low FN−1 signal causes the transistor 404 in the unit delay 310N−1 to turn ON and the turned ON transistors 402, 404 to precharge the BN−1 signal high. The signals propagate through the unit delays 310A–N in this manner until the BB signal from the unit delay 310B is precharged high, turning ON transistors 414, 416 in the unit delay 310A and precharging the FA signal low which, in turn, drives the CLKDEL signal high through the turned ON transistors 402, 404. At this point, the bi-directional delay line 302 is initialized, having precharged the FA-FN−1 signals low and the CLKDEL and BB-BN signals high. Before a time T0 in FIG. 5, the CLKDEL, FA-FE, and BB-BF signals are shown at their precharged levels.

After the bi-directional delay line 302 has been initialized and before the time T0, the control circuit 312 drives the FWD and BWD signal high and low, respectively, to place the delay line in a forward delay mode of operation in anticipation of a rising edge of the CLK signal. At the time T0, a rising edge of the CLK signal is applied to the input buffer 304, and in response to the rising edge of the CLK signal the input buffer 304 generates a rising edge of the CLKBUF signal the delay D1 later at a time T1. In response to the rising edge of the CLKBUF signal at the time T1, the model delay line 306 develops a rising edge of the FDCLK signal the model delay D1+D2 after the time T1, which occurs at just before a time T2. At the time T2, the high FDCLK signal turns ON the transistor 406, driving the CLKDEL signal low through the turned ON transistors 406, 408. In response to the low CLKDEL signal, the transistor 412 turns ON and the FA signal is driven high through the transistors 410, 412, which occurs just after the time T2. The high FA signal turns ON the transistor 406 in the unit delay 310B, which then drives the BB signal low through the transistors 406, 408. As shown in FIG. 5, this falling edge transition of the BB signal occurs a unit propagation delay TPD after the falling edge transition of the CLKDEL signal at just after the time T2. In the forward delay mode, the unit propagation delay TPD introduced by the unit delay 310A may more conveniently be viewed as corresponding to the delay between the rising edge of the FDCLK signal at just before the time T2 and the rising edge of the FA signal just after the time T2.

At just before a time T3, the FB signal from the unit delay 310B goes high in response to the low BB signal, which turns ON the transistors 410, 412 in the unit delay 310B and thereby drives the FB signal high. At the time T3, the subsequent rising edge of the CLK signal is applied to the input buffer 304. The unit delays 310C–E (not shown in FIG. 4) operate in the same way as just described for the unit delays 310A–B, each unit delay 310 receiving the FX–1 signal from the preceding unit delay, which turns ON the transistors 406, 408 in the unit delay and drives the corresponding BX signal low, with the low BX signal turning ON the corresponding transistor 412 to thereby drive the FX signal high through the turned ON transistors 410, 412 in the unit delay, as illustrated for the corresponding signals in FIG. 5.

At a time T4, which is the delay D1 of the input buffer 304 after the time T3, the next rising edge of the CLKBUF signal occurs. In response to this rising edge of the CLKBUF signal at T4, the control circuit 312 drives the FWD and BWD signals low and high, respectively, placing the delay line 302 in a backward delay mode of operation. In response to the low FWD signal, the transistors 408 in each unit delay 310A–N turn OFF and the transistors 402 turn ON, and in response to the high BWD signal the transistors 416 turn ON and the transistors 410 turn OFF.

At the time T4, the FE signal from the unit delay 310E had begun going high to turn ON the corresponding transistor 406 in the unit delay 310F, as illustrated by the FE signal in FIG. 5. Moreover, at the time T4 the transistor 406 in the unit delay 310F had begun turning ON and started driving the BF signal low, as is also illustrated in FIG. 5. But at the time T4, due to the FWD and BWD signals being driven low and high, respectively, the BF signal in the unit delay 310F stops going low and is driven back high by the turned ON transistors 402, 404 in the unit delay 310G. As the BF signal is driven high, the high BF signal turns ON the transistor 414 in the unit delay 310E which, in turn, drives the FE signal back low through the turned ON transistors 414, 416. The unit delays 310E–A thereafter operate in the same way as just described for the unit delays 310E, each unit delay 310X receiving the BX+1 signal from the subsequent unit delay, which turns turn ON the transistors 416, 418 in the unit delay and drives the corresponding FX signal low, with the low FX signal turning ON the corresponding transistor 404 to thereby drive the BX signal high through the turned ON transistors 402, 404 in the unit delay, as illustrated for the corresponding signals in FIG. 5. The delay between the times T3–T4 corresponds to the forward delay FD of the delay line 302. At a time T5, the CLKDEL signal from the unit delay 310A goes high in response to the BB signal going low, with the interval T4–T5 defining a backward delay time BD of the delay line 302. At a time T6, which occurs the delay D2 of the output buffer 308 (FIG. 3) after the time T5, the output buffer drives the CLKSYNC signal in synchronism with a corresponding rising edge of the CLK signal.

In the bi-directional delay line 302, the resolution of the delay line is defined by the analog operation of the last unit delay 310A–N that is utilized in delaying the applied FDCLK signal. In the example of FIG. 5, the unit delay 310F is the final unit delay used in delaying the applied FDCLK signal, and thus the analog operation of the unit delay 310F defines the resolution of the generated forward and backward delays FD+BD. This is true because the analog voltages developed in the final unit delay 310F at the point the delay line 302 terminates operation in the forward delay mode, which corresponds to the time T4 in FIG. 5, are utilized at the start of operation in the backward delay mode, which also corresponds to the time T4. For example, at the time T4 the BF signal in the unit delay 310F returns high from its value at the time T4 and is applied to the transistor 414 in the unit delay 310E to drive the FE signal back low from its value at the time T4. Thus, the time it takes the BF signal in the unit delay 310F to return high depends on its value at the time T4, and this time determines the time required to drive the FE signal back low from its current value at the time T4. The values of these signals at the time T4 thereby determine the propagation delay introduced by the final unit delay 310F.

In the unit delays 310A–N, the delay introduced by the final unit delay 310F is ideally equal for the forward and backward delay modes of operation so that the forward delay FD is equal to the backward delay BD. Thus, in FIG. 5 the waveform of the BF signal around the time T4 is ideally symmetrical since the time T4 defines both the termination of the forward delay mode and the start of the backward delay mode. In order for the delay introduced by the final unit delay 310F to be equal in both the forward and backward delay modes, the NMOS transistors 406, 408 and PMOS transistors 402, 404 must be formed having the proper sizes and operating characteristics or "matched", as will be appreciated by those skilled in the art. More specifically, note that during operation in the forward delay mode the NMOS transistors 406, 408 in the final unit delay 310F begin pulling the BF signal low in response to the high going FE signal from the prior unit delay 310E. When the mode of operation is switched to the backward delay mode, however, it is the PMOS transistors 402, 404 in the final unit delay 310F that drive the BF signal back high. Thus, the rate at which the NMOS transistors 406, 408 drive the BF signal low during the forward delay mode is ideally equal the rate at which the PMOS transistors 402, 404 drive the BF signal high during the backward delay mode.

In order to make the rates at which the NMOS transistors 406, 408 and PMOS transistors 402, 404 drive the BF signal low and high during the forward and backward delay modes, respectively, the transistors must be designed having the required operating characteristics, as previously mentioned. For example, due to the lower majority charge carrier mobility in PMOS transistors, these transistors must be physically larger than corresponding NMOS transistors to provide the same voltage-current characteristics, as will be appreciated by those skilled in the art. For the PMOS transistors 402, 404 to drive the BF signal high during the backward delay mode at the same rate the NMOS transistors 406, 408 drive the signal low during the forward delay mode the PMOS transistors must therefore be physically larger than NMOS transistors. The physically larger size of the PMOS transistors 402, 404, however, increases the capacitances of the PMOS transistors relative to the NMOS transistors 406, 408. This increased capacitance of the PMOS transistors 402, 404 affects the operation the transistors and thus may result in operating characteristics that are different for the PMOS transistors 402, 404 and NMOS transistors 406, 408, which will result in different delays being introduced by the final unit delay 310F and will adversely affect the resolution of the SMD 300.

As previously discussed for the SMD 100 of FIG. 1, the bi-directional delay line 302 in the SMD 300 must provide a maximum variable delay VD (FD+BD) corresponding to the CLK signal having the lowest frequency in the frequency range over which the SMD 300 is designed to operate. This may require the bi-directional delay line 302 to include a relatively large number of unit delays 310A–N which, as previously discussed, can result in significant power consumption by the SMD 300 and which may be undesirable, particularly in applications where the synchronous memory device is contained in a portable battery-powered device.

Moreover, in the SMD 300 the required delay resolution may be difficult to obtain due to the inherent problems associated with properly sizing the NMOS and PMOS transistors in the unit delays 310A–N, as will be appreciated by those skilled in the art. As operating frequencies increase, even small variations in the variable delay VD can introduce undesirable delays or jitter of the CLKSYNC signal relative to the CLK signal.

There is a need for an SMD having good resolution that occupies less space on a semiconductor substrate and consumes less power.

SUMMARY OF THE INVENTION

A synchronous mirror delay (SMD) includes a model delay line that is coupled to a bi-directional delay line. In operation, an initial edge an input clock signal is applied through the model delay line to the bi-directional delay line. The SMD thereafter operates in a forward delay mode to alternately operate the bi-directional delay line in a forward mode and a backward mode to propagate the initial edge of the input clock signal through the bi-directional delay line and delay the initial edge of the input clock signal by a forward delay. In response to a subsequent edge of the input clock signal, the SMD mirrors the propagation of the input clock signal through the bi-directional delay line during the forward mode and further delay the initial edge of the input clock signal by a backward delay that is substantially equal to the forward delay.

DETAILED DESCRIPTION OF THE INVENTION

Figure 6:
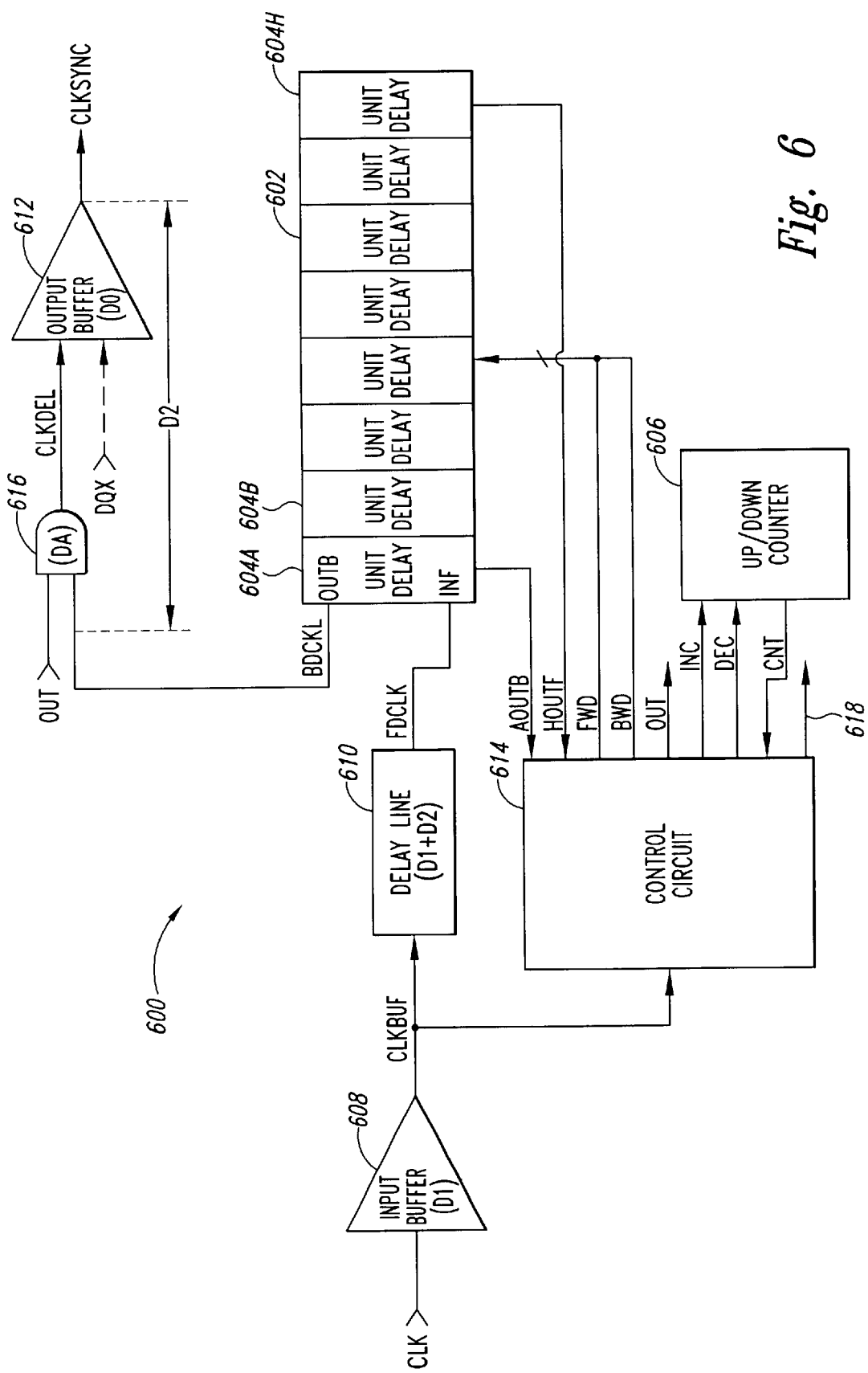
FIG. 6 is a functional block diagram illustrating an SMD including a counter and reduced-size bi-directional delay line according to one embodiment of the present invention.

FIG. 6 is a functional block diagram illustrating an SMD 600 including a reflecting bi-directional delay line 602 including a relatively small number of unit delays 604A–H and an up/down counter 606 that operate in combination to generate a forward delay FD and a backward delay BD that are utilized in generating a synchronized clock signal CLKSYNC that is synchronized with an applied clock signal CLK, as will be described in more detail below. Briefly, the delay line 602 operates in a forward delay mode to propagate an initial rising edge of a forward delayed clock signal FDCLK through the unit delays 604A–H in both directions, with the counter 606 incrementing a count CNT each time the signal passes the first unit delay 604A. The delay line 602 then operates in a backward delay mode to reverse the direction of the propagating rising edge of the FDCLK signal at a given point in time, and the counter 606 thereafter decrements the count CNT each time the signal passes the first unit delay until the count equals 0, at which point a backward delayed clock signal BDCLK is output from the unit delay 604A and utilized to generate the CLKSYNC signal. In one embodiment of the SMD 600, the structure of the unit delays 604A–H eliminates the requirement for matched PMOS and NMOS transistors as previously discussed and thereby provides better resolution than the conventional bi-directional unit delays 310A–N of FIG. 4, as will also be described in more detail below.

In the following description, the rising edge of the FDCLK signal propagating through the unit delays 604A–H may be referred to as simply the FDCLK signal propagating through the unit delays. In addition, certain details are set forth in the following description to provide a sufficient understanding of the present invention. However, it will be clear to one skilled in the art that the present invention may be practiced without these particular details. In other instances, well-known software components and operations, along with ancillary circuits, signals, and communication protocols have not been shown in detail in order to avoid unnecessarily obscuring the present invention.

The SMD 600 includes an input buffer 608 that receives the CLK signal and generates a buffered clock signal CLK-BUF in response to the CLK signal. The CLKBUF signal has a delay D1 relative to the CLK signal, where D1 corresponds to the inherent propagation delay of the input buffer. A model delay line 610 receives the CLKBUF signal and generates the forward delayed clock signal FDCLK having a model delay D1+D2 relative to the CLKBUF signal. The model delays D1 and D2 simulate the delay D1 introduced by the input buffer 608 and a delay D2 introduced by an output buffer 612 that generates the CLKSYNC signal, as will be explained in more detail below. A control circuit 614 generates forward and backward control signals FWD, BWD in response to the CLKBUF signal, the BDCLK signal, and a forward output signals HOUTF from the unit delay 604H. The BDCLK signal from the unit delay 604A corresponds to the CLKDEL signal output from the unit delay 310A of FIG. 4 and the HOUTF signal from the unit delay 604H corresponds to the forward output signals FN from the unit delay 310N of FIG. 4, as will be discussed in more detail below.

The control circuit 614 also generates increment and decrement signals INC, DEC in response to the HOUTF signal, and applies the INC, DEC signals to increment and decrement the count CNT, respectively, generated by the up/down counter 606. The control circuit 614 further generates an output signal OUT that is applied to a first input of an AND gate 616, which receives the BDCLK signal from the bi-directional delay line 602 on a second input and generates a delayed clock signal CLKDEL in response to the OUT and BDCLK signals. The output buffer 612 receives the CLKDEL signal and generates the CLKSYNC in response to the CLKDEL signal, with the CLKSYNC being delayed by a delay D0 introduced by the output buffer. As illustrated by a dotted line in FIG. 6, the output buffer 612 may correspond to a data driver that receives a data signal DQX and outputs the data signal in response to being clocked by the CLKDEL signal, as will be appreciated by those skilled in the art. As illustrated in FIG. 6, the delay DO of the output buffer 612 and a delay DA of the AND gate 616 together form the delay component D2 of the model delay line 610 (D2=DO+DA).

Figure 5:
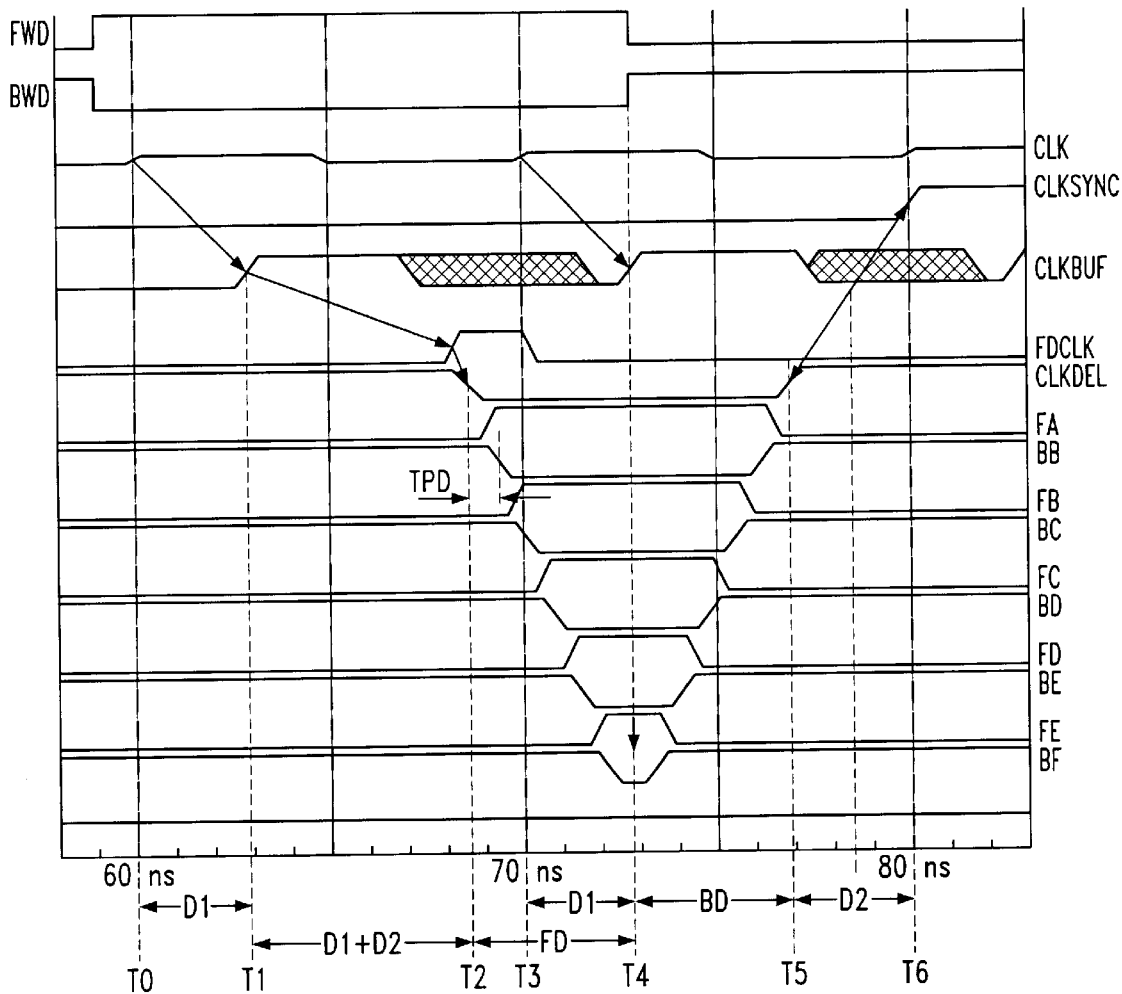
FIG. 5 is a signal timing diagram illustrating various signals in the SMD of FIG. 3 and bi-directional delay line of FIG. 4 during operation.
Figure 7:
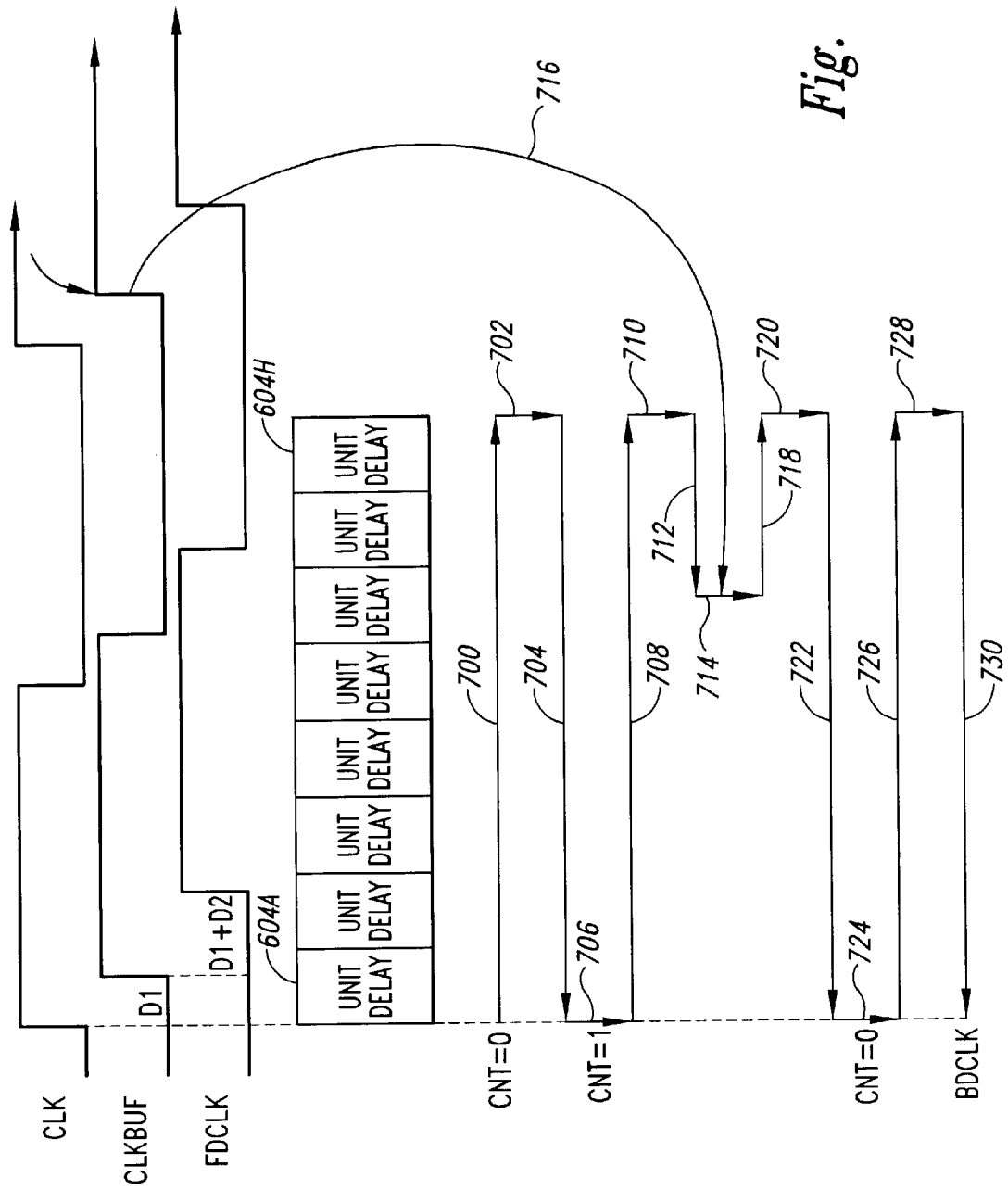
FIG. 7 is a functional diagram illustrating the operation of the SMD of FIG. 6.

The overall operation of the SMD 600 will now be described in more detail with reference to FIG. 6 and with reference to a functional diagram of FIG. 7 that illustrates the CLK, CLKBUF, and FDCLK signals along with the flow of the FDCLK signal through the bi-directional delay line 602 and value of the CNT count during operation. Before commencing operation to generate the CLKSYNC signal, the control circuit 614 resets the counter 606 which, in turn, resets the CNT count to 0, precharges the unit delays 604A–H as previously described for the unit delays 310 of FIG. 5, and drives the OUT signal inactive low to disable the AND gate 616. The control circuit 614 also activates the FWD signal and deactivates the BWD signal, placing the bi-directional delay line 602 in a forward mode of operation. At this point, an initial rising edge N of the CLK signal is applied to the input buffer 608 which, in turn, drives the CLKBUF signal high in response to the CLK signal. In response to the rising edge of the CLKBUF signal, the delay line 610 drives the FDCLK signal high the model delay D1+D2 later. At this point, the FDCLK signal propagates through the unit delays 604A–H in the forward mode (left to right in FIG. 6) as indicated by the line 700.

When the FDCLK signal reaches the end of the bi-directional delay line 602, the output signal HOUTF signal from the unit delay 604H transitions, and in response to this transition the control circuit 614 deactivates the FWD signal and activates the BWD signal, placing the bi-directional delay line 602 in a backward mode of operation. In response to being placed in the backward mode, the FDCLK signal is "reflected," meaning that the direction of the FDCLK signal is reversed and now flows through the unit delays 604A–H from right to left. This reflection of the FDCLK signal is illustrated by the line 702, and the propagation of the FDCLK signal in the backward mode is illustrated by the line 704. The FDCLK signal propagates through the unit delays 604A–H in the backward direction until the output signal BDCLK from the unit delay 604A transitions. In response to this transition of the BDCLK signal, the control circuit 614 activates the INC signal, causing the counter 606 to increment the CNT count from 0 to 1, as indicated in FIG. 7. Also in response to this transition of the BDCLK signal, the control circuit 614 activates the FWD signal and deactivates the BWD signal, once again and placing the bi-directional delay line 602 in the forward mode of operation. In response to being placed in the forward mode, the FDCLK signal is reflected as indicated by line 706, and now flows through the unit delays 604A–H from left to right as indicated by the line 708. Note that the AND gate 616 does not activate the CLKDEL signal in response to this transition of the BDCLK signal since the AND gate is disabled by the low OUT signal from the control circuit 614.

At this point, the FDCLK signal propagates through the unit delays 604A–H in the forward mode as indicated by the line 708 until the signal reaches the end of the bi-directional delay line 602 and the output signal HOUTF from the unit delay 604H once again transitions. In response to this transition of the HOUTF signal, the control circuit 614 deactivates the FWD signal and activates the BWD signal, placing the bi-directional delay line 602 in the backward mode and once again reflecting the FDCLK signal as indicated by the line 710. The FDCLK signal once again begins propagating through the unit delays 604A–H in the backward mode as indicated by the line 712. While the FDCLK signal is propagating through the unit delays 604A–H in the backward mode, the control circuit 614 receives the subsequent rising edge of the CLKBUF signal that the input buffer 608 generates in response to the N+⊕ rising edge of the CLK signal. In response to this rising edge of the CLKBUF signal, the control circuit 614 activates the FWD signal and deactivates the BWD signal, placing the bi-directional delay line 602 in the forward mode and once again reflecting the FDCLK signal as indicated by the line 714. The line 716 in FIG. 7 indicates that the reflection of the FDCLK signal indicated by the line 714 is in response to the subsequent rising edge of the CLKBUF signal. Note that this reflection of the FDCLK signal occurs in the unit delay 604A–H to which the FDCLK signal has propagated when the rising edge of the CLKBUF signal occurs, and does not occur in either the unit delay 604A or the unit delay 604H as in the prior reflections 702, 706, and 710.

At this point, the FDCLK signal propagates through the unit delays 604A–H in the forward mode from left to right as indicated by the line 718 until the output signal HOUTF from the unit delay 604H once again transitions, at which point the control circuit 614 deactivates the FWD signal and activates the BWD signal to place the bi-directional delay line 602 in the backward mode and reflect the FDCLK signal as indicated by line 720. In the backward mode, the FDCLK signal propagates from right to left through the unit delays 604A–H as indicated by the line 722 until the BDCLK signal from the unit delay 604A transitions. In response to this transition of the BDCLK signal, the control circuit 614 activates the DEC signal, causing the counter 606 to decrement the CNT count from 1 to 0. Also in response to this transition of the BDCLK signal, the control circuit 614 activates the FWD signal and deactivates the BWD signal, once again and placing the bi-directional delay line 602 in the forward mode of operation. In response to being placed in the forward mode, the FDCLK signal is reflected as indicated by line 724, and now flows through the unit delays 604A–H from left to right as indicated by the line 726. At this point, the control circuit 614 also activates the OUT signal to thereby enable the AND gate 616. Note that the control circuit 614 does not activate the OUT signal until after the FDCLK has begun propagating through the unit delays 604A–H in the forward mode and after the transition of the BDCLK signal. Thus, the AND gate 616 is not enabled until after this transition of the BDCLK signal occurs and therefore does not activate the CLKDEL signal in response to the transition of the BDCLK signal.

The FDCLK signal then propagates through the unit delays 604A–H in the forward mode from right to left as indicated by the line 726 until the output signal HOUTF from the unit delay 604H once again transitions, at which point the control circuit 614 deactivates the FWD signal and activates the BWD signal to place the bi-directional delay line 602 in the backward mode and reflect the FDCLK signal as indicated by line 728. In the backward mode, the FDCLK signal propagates from right to left through the unit delays 604A–H as indicated by the line 730 until the BDCLK signal from the unit delays 604A transitions. The AND gate 616 drives the CLKDEL signal high in response to the rising edge of the BDCLK signal, and the output buffer 612 drives the CLKSYNC signal high in response to the high CLKDEL signal. The rising edge of the CLKSYNC signal is synchronized with the N+2 rising edge of the CLK signal (not shown in FIG. 7), which occurs 2TCK after the N rising edge of the CLK signal, where TCK is the period of the CLK signal. The SMD 600 operates in this way to generate the CLKSYNC signal that is synchronized with every other rising edge of the CLK signal.

Figure 1:
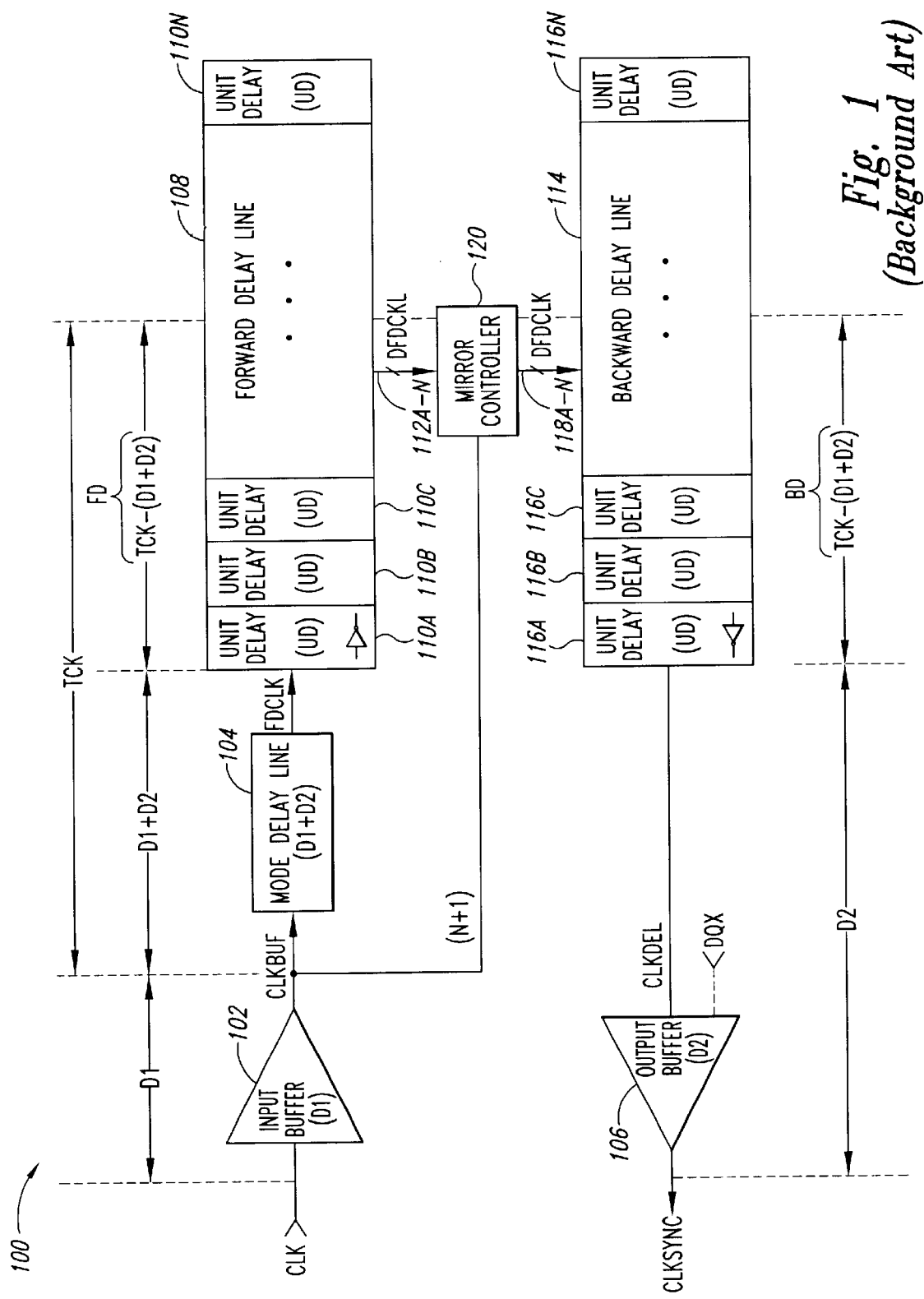
FIG. 1 is a functional block diagram of a conventional SMD.
Figure 2:
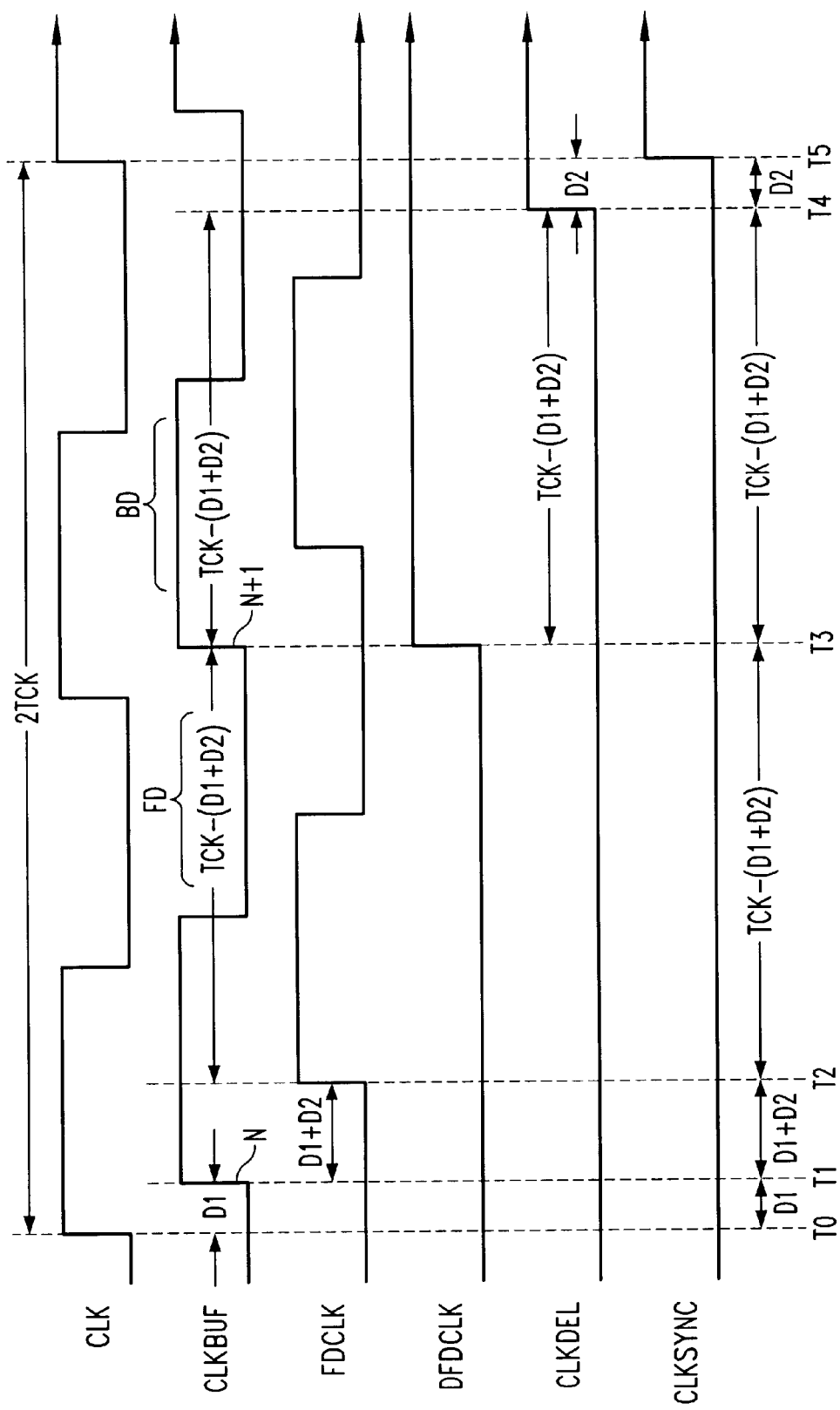
FIG. 2 is a signal timing diagram showing various signals generated by the SMD of FIG. 1 during operation.
Figure 3:
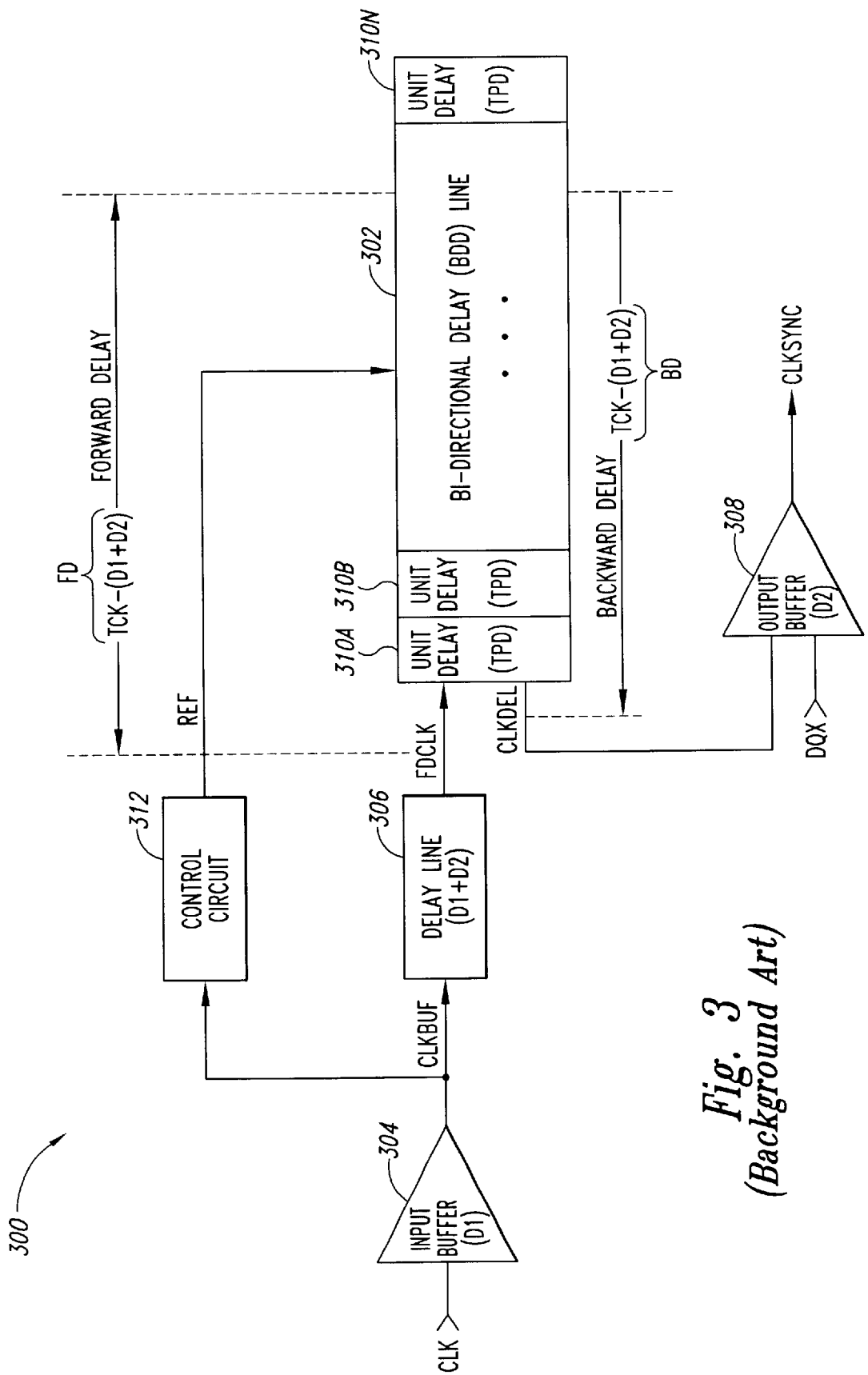
FIG. 3 is a functional block diagram illustrating a conventional SMD including a bi-directional delay line for reducing the power and size of the SMD.

In the SMD 600, the bi-directional delay line 602 is operated alternately in the forward and backward modes to generate a forward delay FD, which is the delay corresponding to the lines 700, 704, 708, and 712. The reflection of the FDCLK signal indicated by the line 714, which occurs in response to the second rising edge of the CLKBUF signal, initiates the replaying of the forward delay FD to thereby generate a backward delay BD, which is the delay corresponding to the lines 718, 722, 726, and 730. The bi-directional delay line 602 also operates alternately in the forward and backward modes in generating the backward delay BD. Each of the forward and backward delays FD, BD has a value of TCK-(D1+D2), just as in the conventional forward and backward delay lines 108, 114 of FIG. 1 and the conventional bi-directional delay line 302 of FIG. 3. During generation of the forward delay FD, the counter 606 increments the CNT count to indicate the number of number of times the FDCLK signal has been reflected during generation of the forward delay. This CNT count is thereafter decremented to reflect the FDCLK signal the same number of times during generation of the backward delay BD.

In contrast to the conventional bi-directional delay line 302, the bi-directional delay line 602 operates alternately in the forward and backward modes in generating each of the delays FD, BD. This allows the bi-directional delay line 602 to include many fewer unit delays 604A–H than the conventional bi-directional delay line 302. This is true because the conventional bi-directional delay line 302 must include the number of unit delays 310A–N required to generate the maximum forward and backward delays FD, BD. In contrast, the bi-directional delay 602 may include many fewer unit delays 604A–H, with the FDCLK signal being delayed for longer periods simply by being reflected through the unit delays more times to generate a longer delay. By utilizing fewer unit delays 604A–H, the bi-directional delay line 602 may be physically smaller and consume less power than the conventional bi-directional delay line 302.

Figure 8:
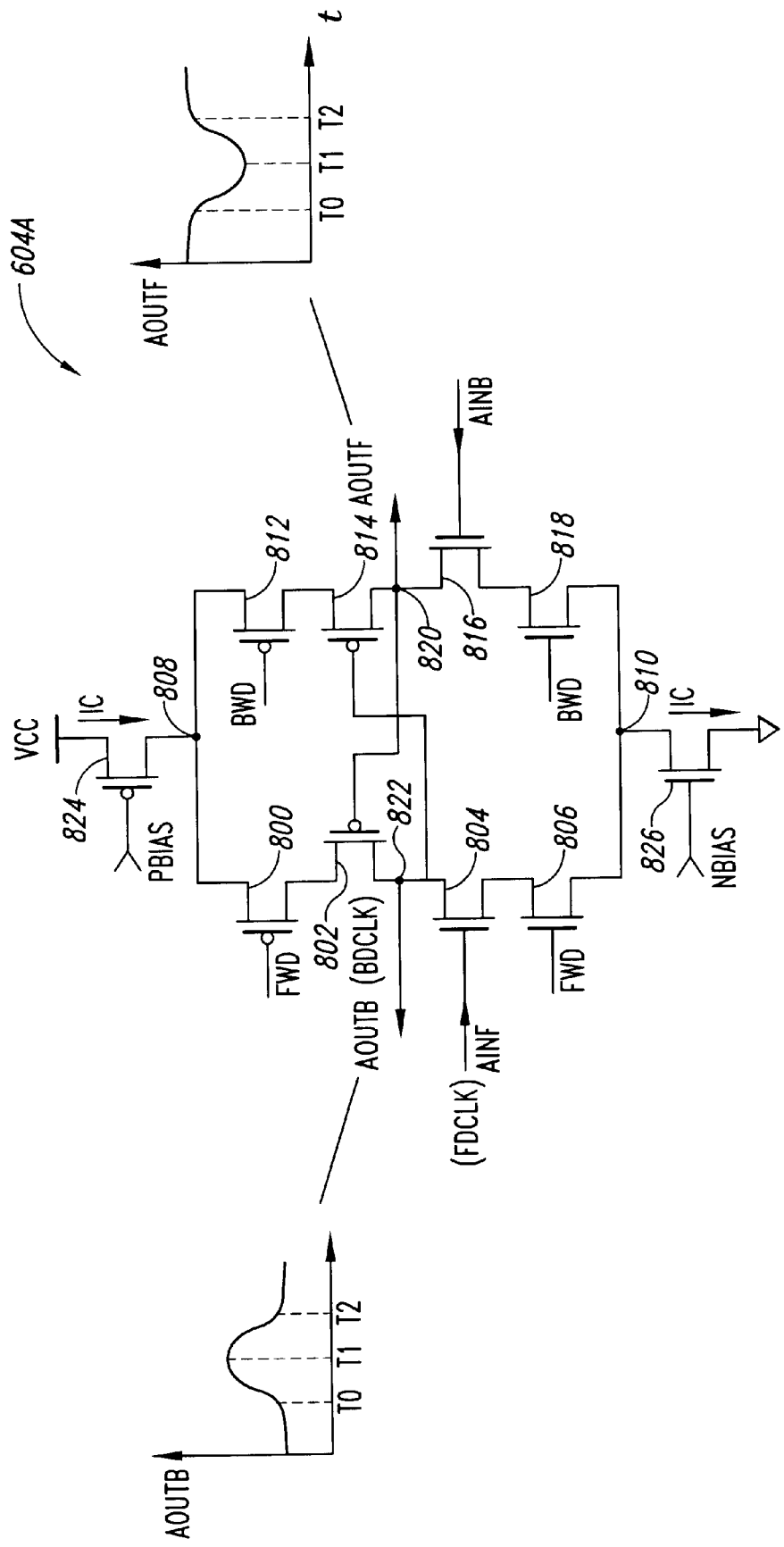
FIG. 8 is a schematic illustrating in more detail a unit delay contained in the bi-directional delay line of FIG. 6.

FIG. 8 is a schematic illustrating one embodiment of the unit delay 604A of FIG. 6. The unit delays 604A–H in the bi-directional delay line 602 all identical, and thus, for the sake of brevity, only the unit delay 604A is illustrated and will be described in more detail with reference to FIG. 8. The unit delay 604A includes a first group of the PMOS and NMOS transistors 800–806 connected in series between a first node 808 and a second node 810, and a second group of PMOS and NMOS transistors 812–818 connected in series between the first and second nodes. The gate of the PMOS transistor 802 is coupled to a forward output node 820 and the gate of the PMOS transistor 814 is coupled to a backward output node 822. When the unit delay 604A is operating in the forward mode, a forward output signal AOUTF signal is developed on the node 820, and when the unit delay is operating in the backward mode a backward output signal AOUTB signal is developed on the node 822. In the unit delay 604A, the AOUTB signal corresponds to the BDCLK signal from the bi-directional unit delay 602.

The unit delay 604A further includes a PMOS bias transistor 824 coupled between the node 808 and a supply voltage source VCC and receiving a bias voltage PBIAS. The PMOS bias transistor 824 provides a relatively constant charging current IC having a value determined by the value of the bias voltage PBIAS. Similarly, an NMOS bias transistor 826 is coupled between the node 810 and a reference voltage source and receives a bias voltage NBIAS. The NMOS bias transistor 826 provides a relatively constant charging current IC having a value determined by the value of the bias voltage NBIAS. The bias voltages PBIAS and NBIAS have values that cause the charging currents IC provided by the bias transistors 824 and 826 to be equal, as will be described in more detail below.

The PMOS transistor 800 and NMOS transistor 806 receive the forward control signal FWD while the PMOS transistor 812 and NMOS transistor 818 receive the backward control signal BWD. The FWD and BWD signals are active high and are complementary signals, meaning that when the FWD signal is high the BWD signal is low and when the BWD signal is high the FWD signal is low. The NMOS transistor 804 receives a forward input signal AINF, which corresponds to the FDCLK signal in the unit delay 604A. The NMOS transistor 816 receives a backward input signal AINB from the adjacent unit delay 604B (not shown in FIG. 8) and the AOUTF signal is applied as the BINF signal to the unit delay 604B.

Figure 4:
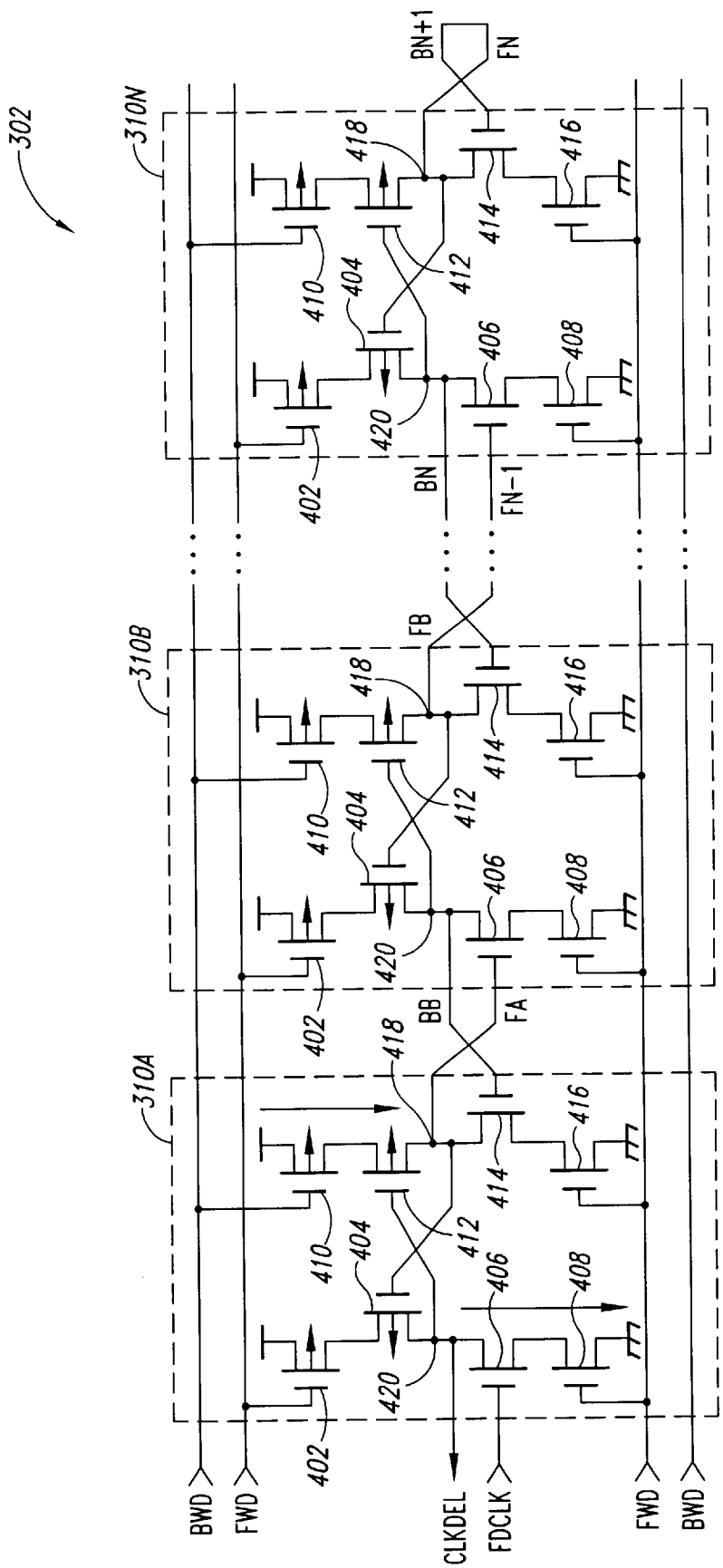
FIG. 4 is a schematic illustrating in more detail the unit delays forming the bi-directional delay line of FIG. 3.

The unit delay 604A, along with the unit delays 604B–H in the bi-directional delay line 602 of FIG. 6, are precharged in the same way as previously described for the conventional unit delays 310A–N of FIG. 4, and thus, for the sake of brevity, this operation will not again be described in detail. Furthermore, the transistors 800–806 and 812–818 operate in the same way as the corresponding transistors 402–416 in the conventional bi-directional unit delays 310A–N of FIG. 4, and thus their operation will not again be described in detail. In the unit delay 604A, the bias transistors 824 and 826 provide the charging current IC to charge and discharge the nodes 820 and 822 during operation of the unit delay. The value of the charging current IC is set at a value that is much less than the drain-to-source current that can be provided by the transistors 800–806 and 812–818 when these transistors are turned ON. In this way, it is the charging current IC that determines the rate at which the nodes 820 and 822 are charged and discharged. In contrast, in the conventional unit delays 310A–N of FIG. 4, it is the drain-to-source current of the NMOS and PMOS transistors 402–416 (FIG. 4) that determine the rate at which the corresponding nodes are charged and discharged, which may adversely affect the resolution of the SMD 300, as previously mentioned.

The analog operation of the unit delay 604A will now be described as if the unit delay is the last unit delay 604A–H delaying the applied FDCLK signal when the next rising edge of the CLKBUF signal is received, as previously discussed with reference to FIG. 7. Thus, the analog operation of the unit delay 604A is described as if the unit delay corresponds to the unit delay delaying the applied FDCLK signal when this signal is reflected as indicated by the line 714 in FIG. 7. As previously discussed, it is the analog operation of this final unit delay that determines the resolution of the SMD 600 (FIG. 6). In this situation, assume the AOUTF signal is initially high and the AOUTB signal is initially low, and the FWD and BWD signals are low and high, respectively, placing the unit delay in the backward mode of operation. The high BWD signal turns ON the transistors 818 and 800, and all other transistors are initially turned OFF. A small signal timing diagram adjacent the node 820 shows the AOUTF signal as a function of time, and illustrates that before a time T0 the AOUTF signal is high.

At the time T0, the AINB signal from the adjacent unit delay 604 goes high, turning ON the transistor 816 and discharging the node 820 through the turned ON transistors 816, 818 and through the bias transistor 826. As the node 820 discharges, the AOUTF signal begins going low as indicated in the signal diagram. As previously mentioned, the rate at which the node 820 discharges is determined by the current IC through the bias transistor 826, which is much smaller than the drain-to-source currents capable of flowing through the transistors 816, 818. Note that as the node 820 discharges, the transistor 802 begins turning ON to thereby begin charging the node 822 high through the turned ON transistors 800, 802 and the bias transistor 824. A small signal timing diagram adjacent the node 822 shows the AOUTB signal as a function of time, and illustrates that before a time T0 the AOUTB signal is low, and that at the time T0 the node begins charging high through the transistors 800, 802, 824. The rate at which the node 822 charges is also determined current IC through the bias transistor 824.

At a time T1, the next rising edge of the CLKBUF signal is received, and the FWD and BWD signals go high and low, respectively. In response to the high FWD signal and the low BWD signal, the unit delay 604A commences operation in the forward mode, and the transistors 818 and 800 turn OFF and the transistors 806 and 812 turn ON in response to the FWD, BWD signals. At this point, the AINF signal from the adjacent unit delay 604 is high, which also turns ON the transistor 804. The node 822 begins discharging through the turned ON transistors 804, 806, and 826 at a rate determined by the current IC through the bias transistor 826, as illustrated in the signal timing diagram. Note that the node 822 was charged at a rate determined by the current IC through the bias transistor 824 and is now discharged at a rate determined by the current through the bias transistor 826, and is therefore charged and discharged at the same rate. In response to the low AOUTB signal on the node 822, the transistor 814 turns ON and the node 820 begins charging through the turned ON transistors 814, 812, and 824. Once again, the rate at which the node 820 charges is determined by the current IC through the bias transistor 824, and is equal to the rate at which the node 820 was previously discharged which was determined by the current IC through the bias transistor 826.

At a time T2, the AOUTB and AOUTF signals have returned to their original low and high levels, respectively. Because the nodes 820 and 822 are charged and discharged at the same rates, which are determined by the current IC through the bias transistors 824, 826, the interval T0–T1 is equal to the interval T1–T2 for the AOUTB and AOUTF signals. As a result, the delay introduced by the unit delay 604A is equal in both the forward and backward mode of operation, which means the resolution of the SMD 600 of FIG. 6 is improved when compared to the conventional SMD 300 of FIG. 3.

Figure 9:
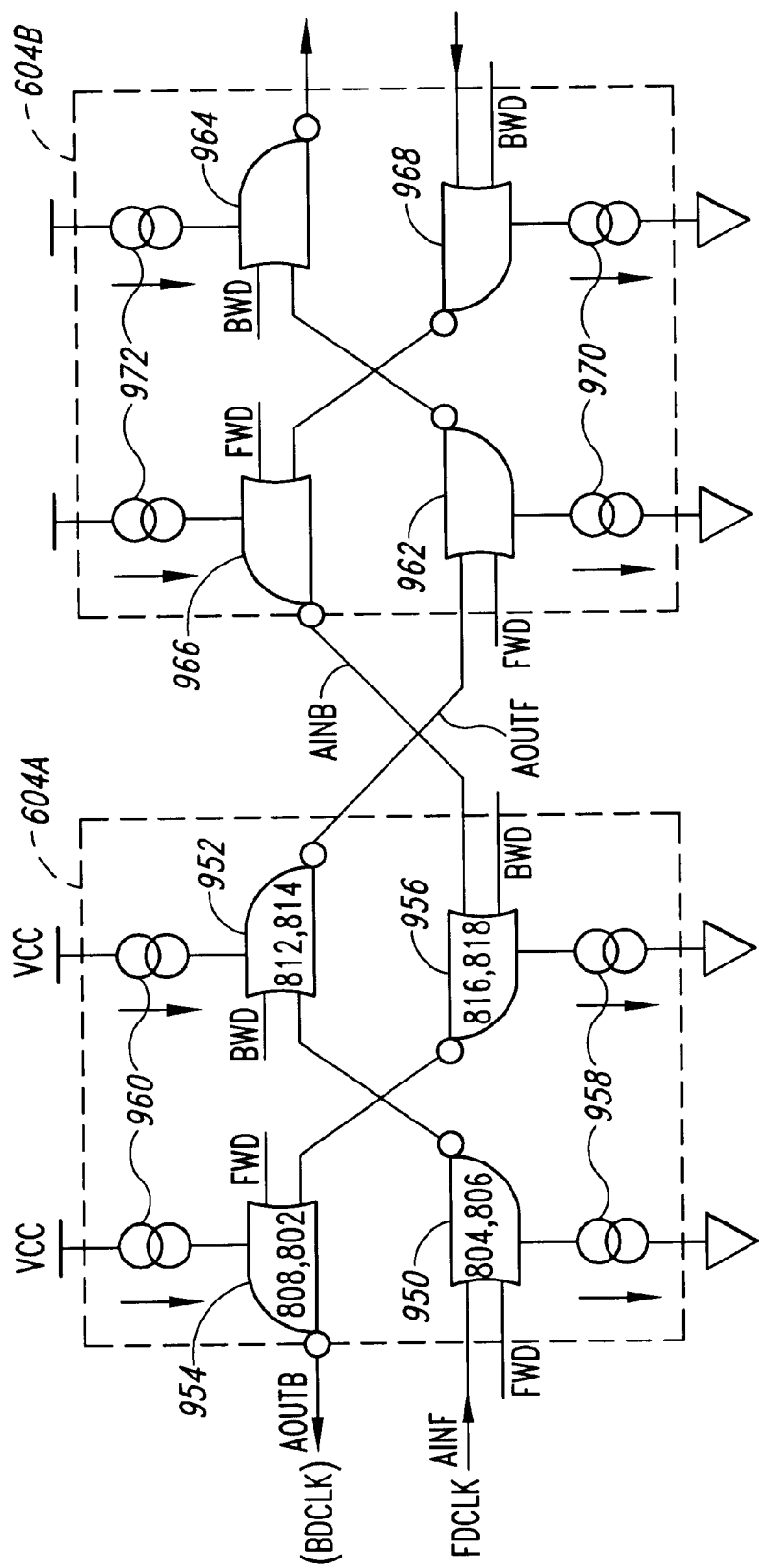
FIG. 9 is a functional diagram illustrating in more detail the operation of the bi-directional delay line and unit delays of FIGS. 6 and 8, respectively.

FIG. 9 is a functional block diagram illustrating the operation of the bi-directional delay line 602 in the forward and backward modes of operation. In FIG. 9, the two unit delays 604A and 604B are functionally illustrated. In the unit delay 604A, a NAND gate 950 corresponds to the transistors 804, 806, a NAND gate 952 corresponds to the transistors 812, 814, a NAND gate 954 corresponds to the transistors 800, 802, and a NAND gate 956 corresponds to the transistors 816, 818. Two current sources 958 correspond to the bias transistor 826 and two current sources 960 correspond to the bias transistor 824. The components 962–972 in the unit delay 604B correspond to the components 950–960 in the unit delay 604A, respectively. In operation during the forward mode, the FDCLK signal propagates through the NAND gates 950, 952, 962, and 964 and is delayed as previously described. The NAND gates 950, 952, 962, and 964 are in bold to illustrate that that these NAND gates operating combination to form the delay signal path for the FDCLK signal during the forward mode. In operation during the backward mode, the FDCLK signal propagates through the NAND gates 968, 966, 956, and 954 and is delayed as previously described. Thus, these NAND gates operating combination to form the delay signal path for the FDCLK signal during the backward mode.

Figure 10:
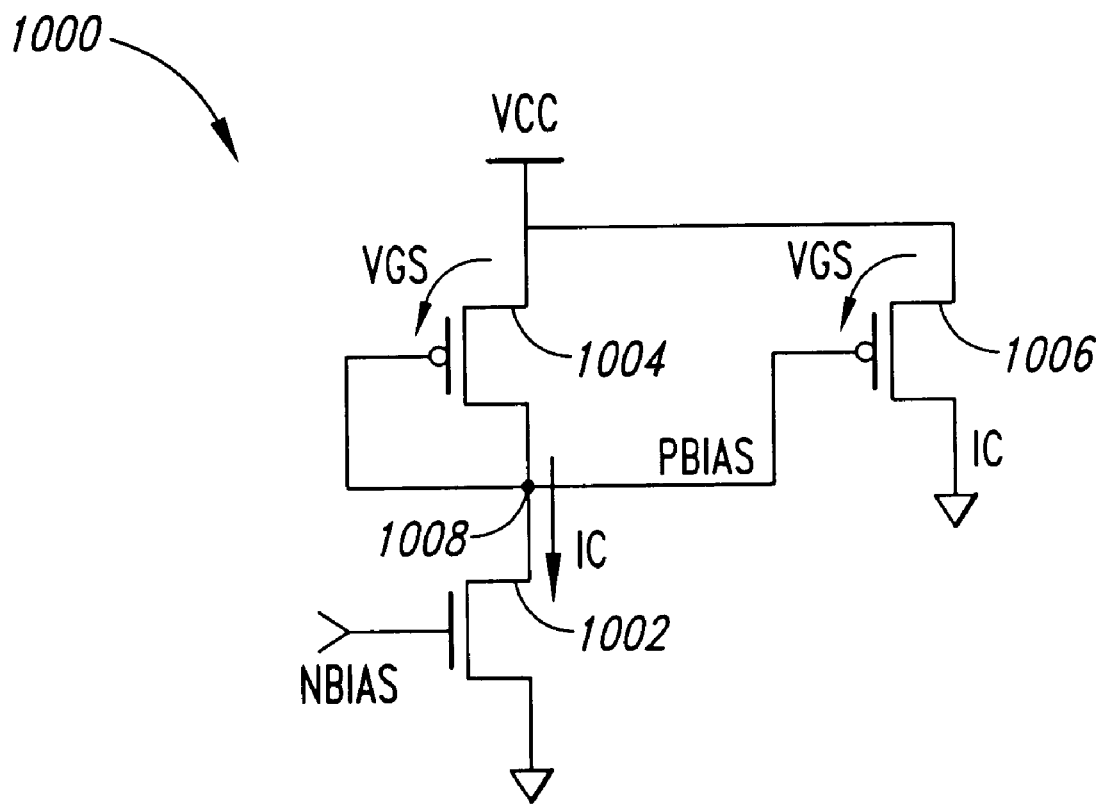
FIG. 10 is a schematic illustrating a simplified current mirror for matching charging currents through the NMOS and PMOS bias transistors in the unit delay of FIG. 8.

FIG. 10 is a schematic illustrating simplified current mirror circuit 1000 for generating the bias voltage PBIAS in response to the bias voltage NBIAS. The mirror circuit 1000 includes an NMOS transistor 1002 having the same operating characteristics as the bias transistor 826 in the unit delay 604A of FIG. 8. A diode-coupled PMOS transistor 1004 is coupled in series with the transistor 1002 between a supply voltage source VCC and a reference voltage source. A PMOS transistor 1006, which corresponds to the bias transistor 824 in the unit delay 604A of FIG. 8, has its gate coupled to a node 1008 to receive the PBIAS voltage, and has its source coupled to the supply voltage source VCC. The PMOS transistors 1004, 1006 are matched so that they have the same operating characteristics. In operation, in response to the NBIAS signal, the NMOS transistor 1000 causes a current IC to flow-through the diode-coupled PMOS transistor 1004 and the NMOS transistor 1002. The PMOS transistor 1004 has a gate-to-source voltage VGS that causes the current IC to flow-through the transistor. The PMOS transistor 1006 as the same gate-to-source voltage VGS, and therefore, because the transistors 1004, 1006 are matched, the current IC also flows through the PMOS transistor 1006. In this way, if the PMOS transistor 1004 is matched to the PMOS transistors 824 in the unit delay 604A of FIG. 8, the current IC through the PMOS transistors 824 will equal the current IC through the NMOS transistors 826, as previously described.

Figure 11:
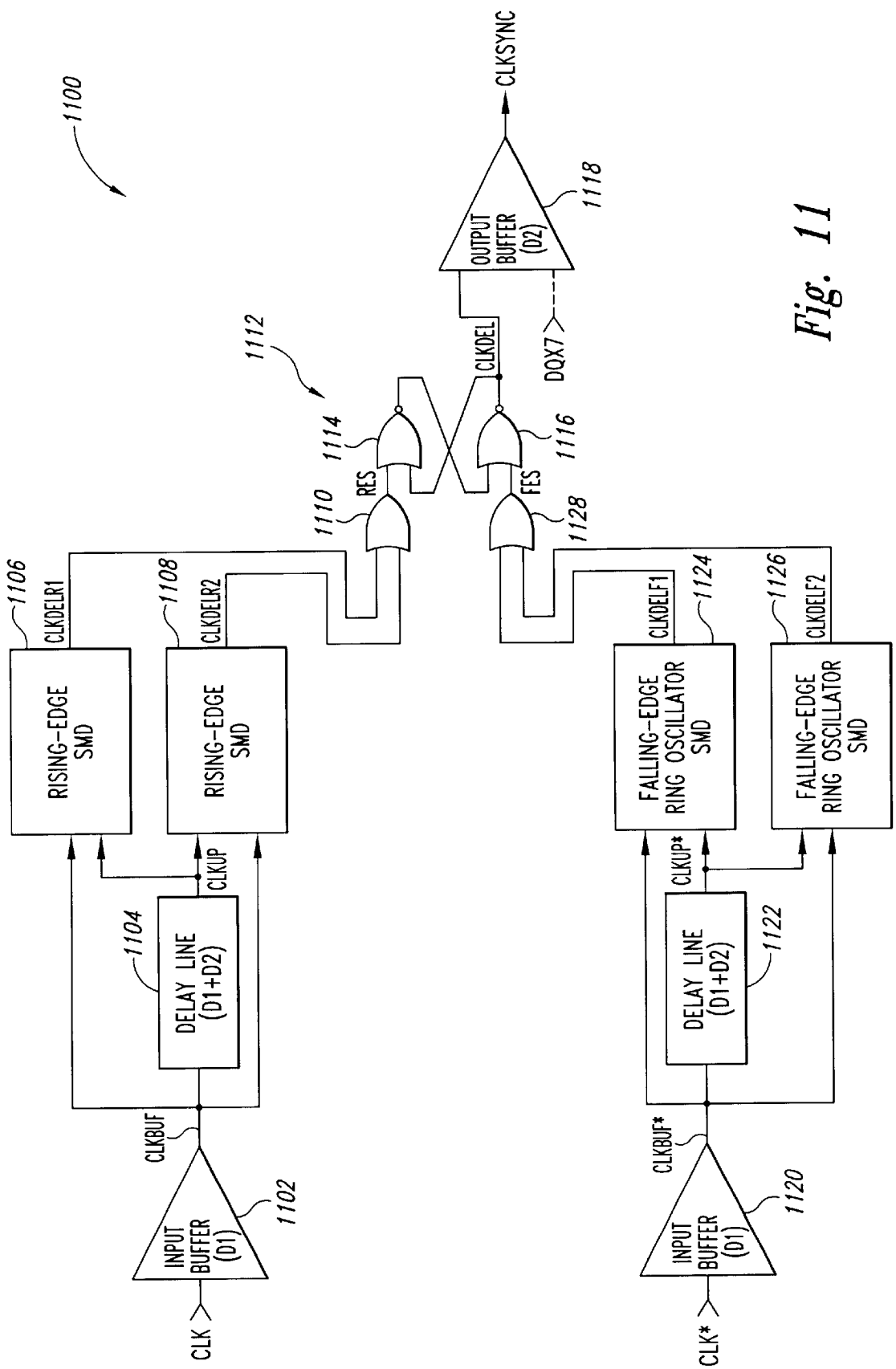
FIG. 11 is a functional block diagram illustrating an SMD including four of the SMDs of FIG. 6 for generating a clock signal having rising and falling edges synchronized with an applied clock signal according to one embodiment of the present invention.

FIG. 11 is a functional block diagram illustrating an SMD 1100 that generates a synchronized clock signal CLKSYNC having rising and falling edges that are synchronized with corresponding rising and falling edges of an applied clock signal CLK. The SMD 1100 includes an input buffer 1102 and a delay line 1104 that develop a CLKBUF and a CLKUP signal, respectively, in response to an applied clock signal CLK in the same way as previously described for the corresponding components in the SMD 600 of FIG. 6. The CLKBUF and CLKUP signals are applied to first and second rising-edge SMD circuits 1106, 1108 that correspond to the components in the SMD 600 that receive the CLKBUF and CLKUP signals and generate the CLKDEL signal in response to these signals. The circuit 1106 generates a rising-edge delayed clock signal CLKDELR1 having a desired delay relative to even alternate rising edges of the CLK signal, and the circuit 1108 generates a rising-edge delayed clock signal CLKDELR2 having a desired delay relative to odd alternate rising edges of the CLK signal. An OR gate 1110 receives the CLKDELR1–2 signals and generates a rising edge strobe RES in response to these signals. An RS flip-flop 1112 formed by two cross-coupled NOR gates 1114, 1116 receive the RES signal on a set input and generates a CLKDEL signal having rising edges that have a predetermined delay relative to rising edges of the CLK signal. In response to the CLKDEL signal, an output buffer 1118 generates the CLKSYNC signal having rising edges that are synchronized with rising edges of the CLK signal An input buffer 1120 and a delay line 1122 develop a CLKBUF* and a CLKUP* signal, respectively, in response to an applied complementary clock signal CLK* in the same way as previously described for the corresponding components in the SMD 600 of FIG. 6. The CLKBUF*, CLKUP* signals are applied to SMD circuits 1124, 1126 that correspond to the components in the SMD 600 that receive the CLKBUF and CLKUP signals and generate the CLKDEL signal in response to these signals. The circuit 1124 generates a falling-edge delayed clock signal CLKDELF1 having a desired delay relative to even alternate falling edges of the CLK signal, and the circuit 1126 generates a falling-edge delayed clock signal CLKDELF2 having a desired delay relative to odd alternate falling edges of the CLK signal. The OR gate 1110 receives the CLKDELF1–2 signals and generates a falling edge strobe FES in response to these signals. The RS flip-flop 1112 receives the FES signal on a reset input and generates the CLKDEL signal having falling edges that have a predetermined delay relative to falling edges of the CLK signal. The output buffer 1118 generates the CLKSYNC signal having falling edges that are synchronized with falling edges of the CLK signal in response to the CLKDEL signal.

Figure 12:
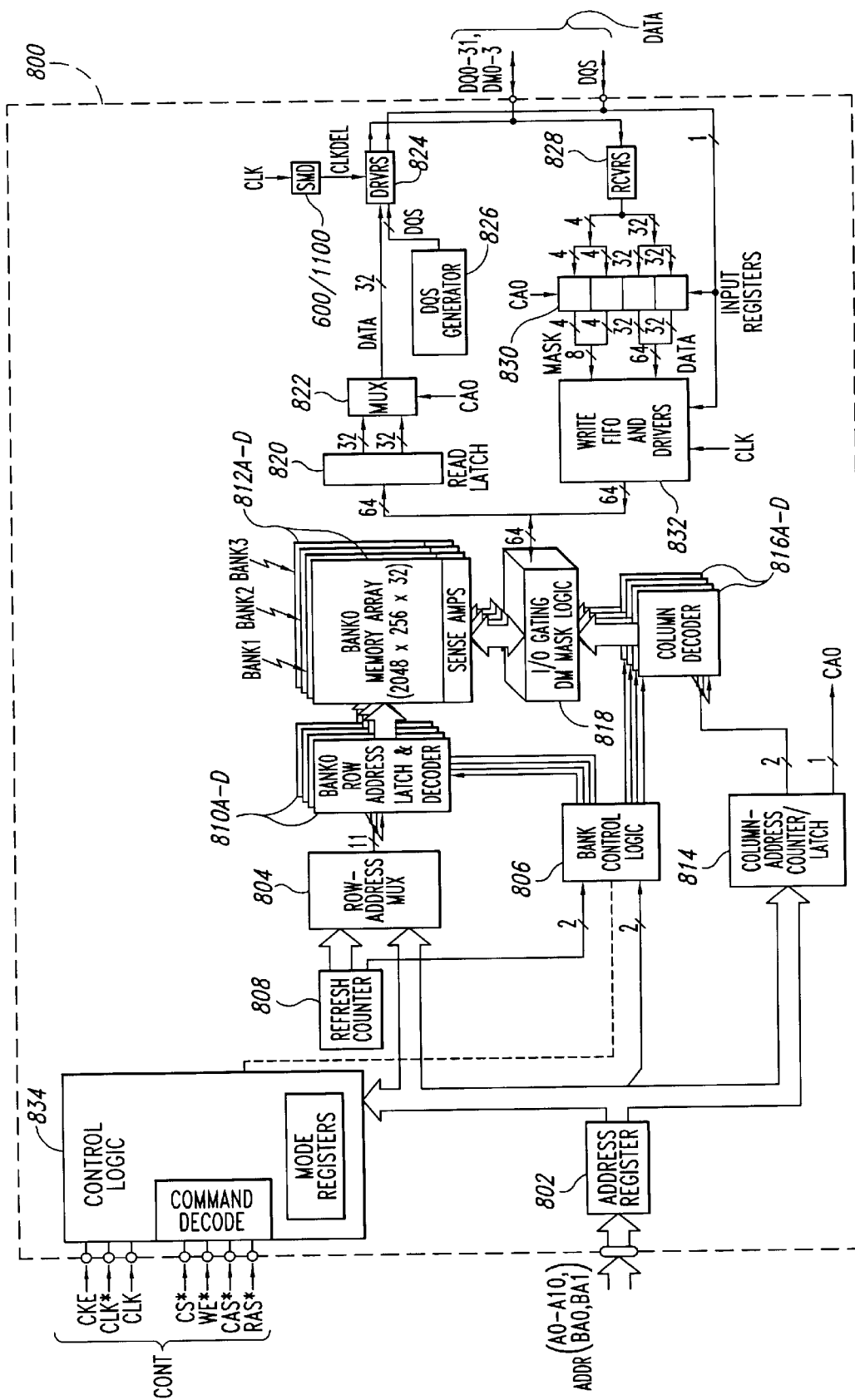
FIG. 12 is a functional block diagram of a synchronous memory device including the SMD of FIG. 6 and/or FIG. 11.

FIG. 12 is a functional block diagram of a memory device 800 including he SMD 600 of FIG. 6 and/or the SMD 1100 of FIG. 11. The memory device 800 in FIG. 12 is a double-data rate (DDR) synchronous dynamic random access memory ("SDRAM"), although the principles described herein are applicable to any memory device that may include an SMD for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A–D. The bank control logic 806 activates the row address latch and decoder 810A–D corresponding to either the bank address received from the address register 802 or a refresh bank address from the refresh counter 808, and the activated row address latch and decoder latches and decodes the received row address. In response to the decoded row address, the activated row address latch and decoder 810A–D applies various signals to a corresponding memory bank 812A–D to thereby activate a row of memory cells corresponding to the decoded row address. Each memory bank 812A–D includes a memory-cell array having a plurality of memory cells arranged in rows and columns, and the data stored in the memory cells in the activated row is stored in sense amplifiers in the corresponding memory bank. The row address multiplexer 804 applies the refresh row address from the refresh counter 808 to the decoders 810A–D and the bank control logic circuit 806 uses the refresh bank address from the refresh counter when the memory device 800 operates in an auto-refresh or self-refresh mode of operation in response to an auto- or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A–D. The bank control logic 806 activates the column decoder 816A–D corresponding to the received bank address, and the activated column decoder decodes the applied column address. Depending on the operating mode of the memory device 800, the column address counter and latch 814 either directly applies the latched column address to the decoders 816A–D, or applies a sequence of column addresses to the decoders starting at the column address provided by the address register 802. In response to the column address from the counter and latch 814, the activated column decoder 816A–D applies decode and control signals to an I/O gating and data masking circuit 818 which, in turn, accesses memory cells corresponding to the decoded column address in the activated row of memory cells in the memory bank 812A–D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer 822. In the embodiment of FIG. 12, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and the delayed clock signal CLKDEL from the SMD 600/1100. The DQS signal is used by an external circuit such as a memory controller (not shown) in latching data from the memory device 800 during read operations. In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the SMD 600/1100 is a delayed version of the CLK signal, and the SMD 600/1100 adjusts the delay of the CLKDEL signal relative to the CLK signal to ensure that the DQS signal and the DQ words are placed on the DATA bus in synchronism with the CLK signal, as previously described with reference to FIGS. 6 and 11. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 828 receives each DQ word and the associated DM0-X signals, and applies these signals to input registers 830 that are clocked by the DQS signal. In response to a rising edge of the DQS signal, the input registers 830 latch a first N/2 bit DQ word and the associated DM0-X signals, and in response to a falling edge of the DQS signal the input registers latch the second N/2 bit DQ word and associated DM0-X signals. The input register 830 provides the two latched N/2 bit DQ words as an N-bit word to a write FIFO and driver 832, which clocks the applied DQ word and DM0-X signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A–D subject to the DM0-X signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802–832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating the control and timing signals is conventional, and thus, for the sake of brevity, will not be described in more detail.

Figure 13:
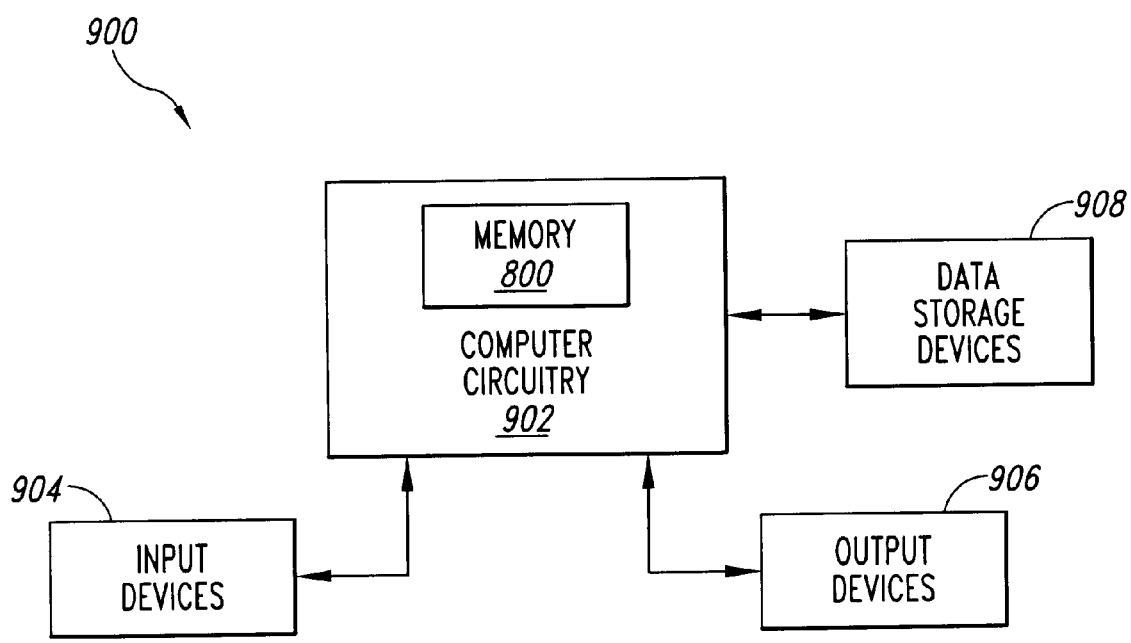
FIG. 13 is a functional block diagram of a computer system including the memory device of FIG. 12.

FIG. 13 is a block diagram of a computer system 900 including computer circuitry 902 that includes the memory device 800 of FIG. 12. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

Figure 14:
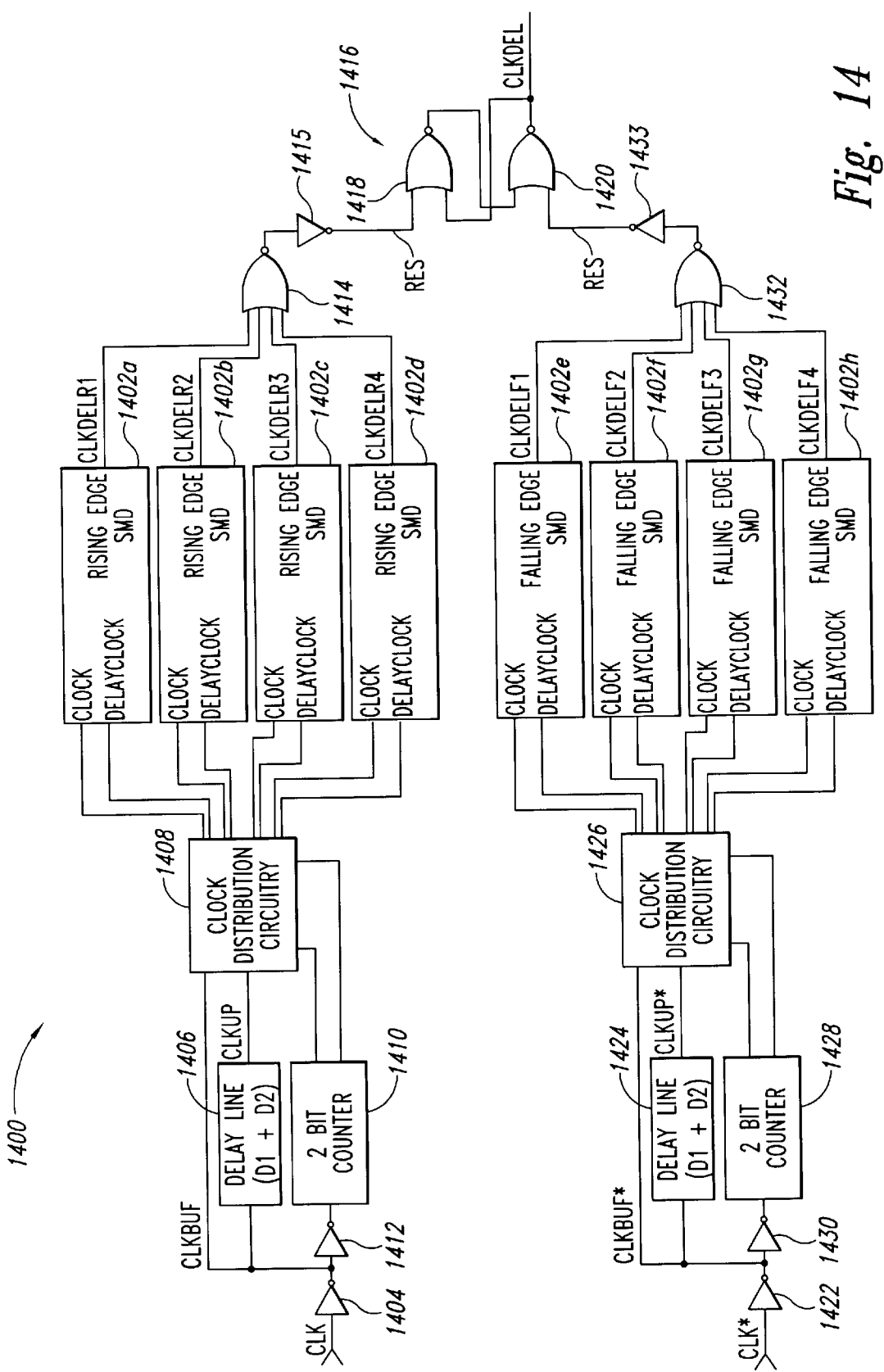
FIG. 14 is a functional block diagram illustrating an SMD including eight SMDs of FIG. 6 to generate a delayed clock signal in applications having a relatively long model delay according to another embodiment of the present invention.

FIG. 14 is a functional block diagram illustrating another embodiment of an SMD 1400 including eight SMDs 1402A–H that collectively generate a delayed clock signal CLKDEL responsive to an applied clock signal CLK in applications having a relatively long model delay D1+D2, as will be explained in more detail. The fixed model delay D1+D2 in the prior SMDs of FIGS. 6 and 11 can result in improper operation as the frequency of the CLK signal being delayed increases. This is true because as the frequency of the CLK signal increases, the fixed model delay D1+D2 becomes a relatively larger portion of the overall delay being provided by each SMD. When the frequency of the CLK signal becomes large enough, the SMD may need to begin operating in the backward mode prior to receiving the edge being delayed from the corresponding delay line. In this case, the SMD cannot properly delay the applied CLK signal, as will be appreciated by those skilled in the art. As a result, as the frequencies of CLK signals to be delayed increase, with the prior SMDs the maximum frequency CLK signal capable of being delayed may be undesirably limited by the delay D1+D2 presented by the delay line. The SMD 1400 increases the delay provided by each SMD and thus makes the fixed model delay D1+D2 a smaller portion of the overall delay, allowing proper operation at higher frequencies of the CLK signal, as will be explained in more detail below.

Each of the SMDs 1402A–H corresponds to the components in the SMD 600 of FIG. 6 that receive the CLKBUF and CLKUP signals and generate the CLKDEL signal in response to these signals. The SMD 1400 includes an input buffer 1404 and a delay line 1406 that develop a CLKBUF and a CLKUP signal, respectively, in response to an applied clock signal CLK in the same way as previously described for the corresponding components in the SMD 600 of FIG. 6. The CLKBUF and CLKUP signals are applied through a clock distribution circuit 1408 that functions as a demultiplexer to provide the CLKUP signal to one of the four SMDs 1402A–D in response a two-bit count generated by a counter 1410. The clock distribution circuit 1408 also provides the CLKBUF signal to appropriate ones of the SMDs 1402A–D to control the forward and backward modes of operation of each SMD. The CLKBUF signal is also applied through an inverter 1412 to clock the counter 1410 which, in turn, increments the two-bit count responsive to each rising-edge of the output from the inverter and thus responsive to each falling-edge of the CLKBUF signal. The clock distribution circuit 1408 and counter 1410 operate in combination to apply the CLKUP and CLKBUF signals to each SMD 1402A–D such that the forward and backward delay provided by each SMD is twice as long as in the SMD 600 of FIG. 6 and the SMDs 1106, 1108, 1124, 1126 of FIG. 11, as will be explained in more detail below. One skilled in the art will understand circuitry for forming the clock distribution circuit 1408 and counter 1410, and thus, for the sake of brevity, such circuitry is not described in more detail.

Each of the SMDs 1402A–D generates a respective rising-edge delayed clock signal CLKDELR1–CLKDELR4 having a desired delay relative to a corresponding rising edge of the CLK signal. More specifically, the SMD 1402A generates the CLKDELR1 signal having a desired delay relative to a first rising edge of the CLK signal and to every fourth rising edge of the CLK signal thereafter. Thus, the SMD 1402A may be viewed as generating CLKDELR1 signal having a desired delay relative to the first, fifth, ninth, thirteenth, and so on rising edges of the applied CLK signal. Similarly, the SMD 1402B generates the CLKLDELR2 signal having a desired delay relative to a second rising edge of the CLK signal and to every fourth rising edge of the CLK signal thereafter. Thus, the SMD 1402B may be viewed as generating CLKDELR2 signal having a desired delay relative to the second, sixth, tenth, fourteenth, and so on rising edges of the applied CLK signal. The SMDs 1402C and 1042D similarly generate the CLKLDELR3 and CLKDELR4 signals having desired delays relative to a third and fourth rising edges of the CLK signal, respectively, and to every fourth rising edge of the CLK signal thereafter. A NOR gate 1414 receives the CLKDELR1–4 signals and applies an output through an inverter 1415 to generate a rising edge strobe RES in response to these signals. An RS flip-flop 1416 formed by two cross-coupled NOR gates 1418, 1420 receives the RES signal on a set input and generates the CLKDEL signal having rising edges that have a predetermined delay relative to rising edges of the CLK signal.

An input buffer 1422 and a delay line 1424 develop a CLKBUF* and a CLKUP* signal, respectively, in response to an applied complementary clock signal CLK* in the same way as previously described for the buffer 1404 and delay line 1406. A clock distribution circuit 1426, counter 1428, and inverter 1430 operate in the same way as the corresponding components 1408, 1410, 1412, respectively, to apply respective rising edges of the CLKUP* and CLKBUF signals to the SMDs 1402E–H. Each of the SMDs 1402E–H generates a respective falling-edge delayed clock signal CLKDELF1–CLKDELF4 having a desired delay relative to a corresponding falling edge of the CLK signal. More specifically, the SMD 1402E generates the CLKLDELF1 signal having a desired delay relative to a first rising edge of the CLK* signal and to every fourth rising edge of the CLK* signal thereafter. The first rising edge of the CLK* signal corresponds to the first falling edge of the CLK signal, thus the CLKDELF1 signal has a desired delay relative to the first falling edge of the CLK signal. Thus, the SMD 1402E may be viewed as generating CLKDELF1 signal having a desired delay relative to the first, fifth, ninth, thirteenth, and so on falling edges of the applied CLK signal. The SMDs 1402F–H operate in the same way as the SMDs 1402B–D except with regard to corresponding falling edges of the CLK signal. A NOR gate 1432 receives the CLKDELF1–4 signals and applies an output through an inverter 1433 to generate a falling edge strobe FES in response to these signals. The RS flip-flop 1416 receives the FES signal on a reset input and generates the CLKDEL signal having falling edges that have a predetermined delay relative to falling edges of the CLK signal.

Figure 15:
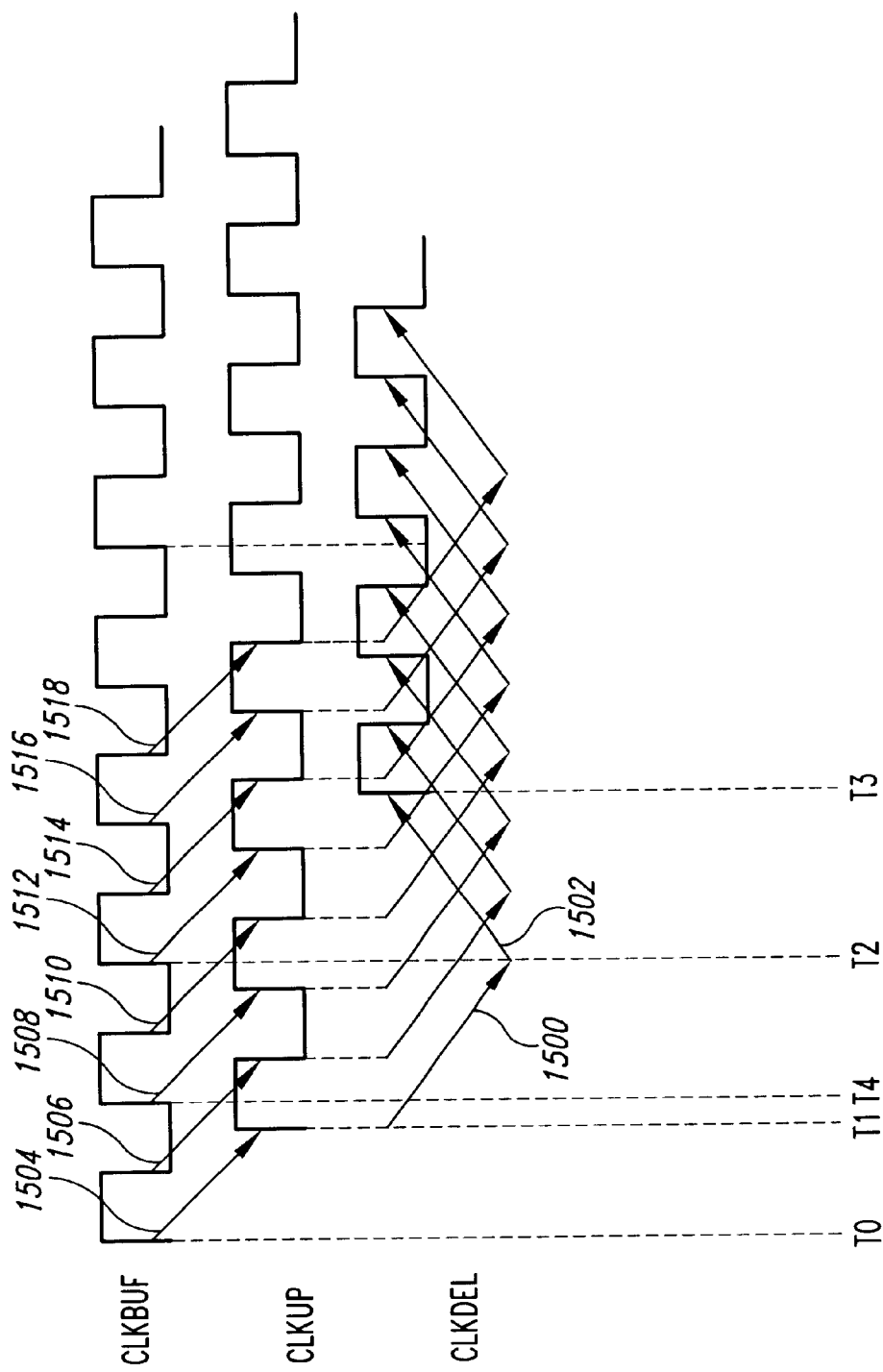
FIG. 15 is a signal timing diagram illustrating the operation of the SMD of FIG. 14.

The overall operation of the SMD 1400 will now be described in more detail with reference to FIG. 15, which is a signal timing diagram illustrating the operation of the SMD 1400. The signal timing diagram illustrates signals relative to the generated CLKDEL signal relative to respective edges of the CLKUP and CLKBUF signals. The operation of the SMD 1402A will be described first. In response to a first rising edge of the CLKBUF signal at time T0, the delay line 1406 generates a first rising edge of the CLKUP signal at a time T1. The clock distribution circuit 1408 applies this first rising edge of the CLKUP signal to the SMD 1402A, which operates in the forward delay mode to delay this rising edge. The delay generated by the SMD 1402A in the forward delay mode is represented by an arrow 1500 from the time T1 until a time T2, at which point the SMD 1402A commences operation in the backward mode responsive to the third rising edge of the CLKBUF signal. The delay in the backward mode is represented by an arrow 1502. The SMD 1402A generates the CLKDELR1 signal at just before a time T3, and in response to the CLKLDELR1 signal the NOR gate 1414 and inverter 1415 activate the RES signal which, in turn, causes the latch 1416 to drive the CLKDEL signal high at the time T3.

The SMD 1402A generates the total delay from the time T1–T3, which is twice the delay provided by the prior SMDs of FIGS. 6 and 11. The delay is twice because instead of placing the SMD 1402A in the backward mode in response to the next rising edge of the CLKBUF signal after the edge being delayed, the SMD 1402A is not placed in the backward mode until the second rising edge of the CLKBUF signal after the edge being delay. More specifically, the SMD 1402A operates in the forward delay mode until the rising edge of the CLKBUF signal at the time T2 instead of the prior rising edge of the CLKBUF signal at a time T4, as would the prior SMDs of FIGS. 6 and 11. By increasing the delay provided by the SMD 1402A, the SMD operates properly even where the delay D1+D2 generated by the delay line 1406 becomes larger relative to the period of the CLK signal being delayed. In prior SMDs, the interval from T1 to T4 may be so small that the SMD could not properly delay the applied edge of the CLKUP signal. The increased delay provided by the SMD 1402A thus allows applied CLK signals having higher frequencies to be properly delayed. In the embodiment of FIG. 15, the SMD 1402A provides an additional delay that is equal to period of the applied CLK signal, although other integer multiples of this period could also be provide to increase the overall delay of the SMD 1402A and allow proper operation at higher frequencies of the CLK signal. The clock distribution circuit 1408 and counter 1410 operate in combination to reverse the mode of operation of the SMD 1402A responsive to the appropriate edge of the CLKBUF signal.

Each of the other SMDs 1402B–H operates in an manner analogous to that just described for the SMD 1402A on corresponding rising and falling edges of the applied CLK signal, and thus, for the sake of brevity, the operation of each of the SMDs 1402B–H will not be described in more detail. In FIG. 15, the arrows 1504–1518 indicate the edges of CLK signal delayed by the SMDs 1402A–H, respectively. The SMD 1400 requires more individual SMDs 1402A–H since the delay being provide by each is larger than in the previous embodiment of FIG. 11, and thus additional SMDs are required to delay edges that occur while a given SMD is delay a respective edge of the applied CLK signal, as will be appreciated by those skilled in the art. The longer the delay provided by each SMD the more individual SMDs required.

Figure 16:
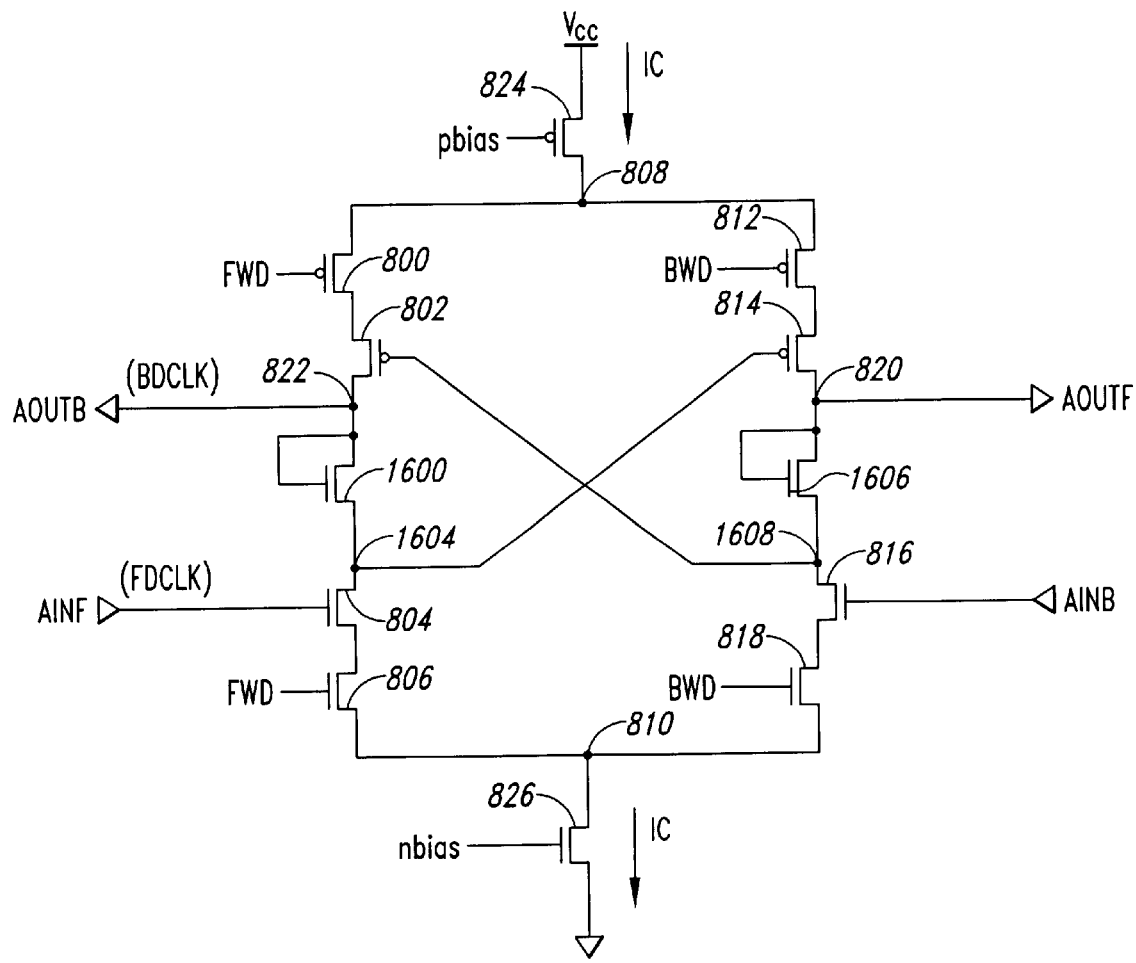
FIG. 16 is a schematic illustrating another embodiment of the unit delay contained in the bi-directional delay line of FIG. 6 and in the SMDs of FIGS. 11 and 14.

FIG. 16 is a schematic illustrating another embodiment of the unit delay 604A of FIG. 6. The unit delay 604A of FIG. 16 includes components 800–826 previously described with reference to FIG. 8, and thus, for the sake of brevity, these components will not again be described in detail. The unit delay 604A of FIG. 16 further includes a first diode-coupled transistor 1600 coupled between node 822 and a node 1602 and a second diode-coupled transistor 1606 coupled between the node 820 and a node 1608. The diode-coupled transistors 1606, 1600 ensure that the nodes 820, 822 never go below a threshold voltage VT1 the NMOS transistors 804, 806, 816, 818, and ensure the nodes 1604, 1608 never go above a voltage VCC-VT2, where VT2 is a threshold voltage of the PMOS transistors 800, 802, 812, 814 and is assumed to be equal to VT1. These threshold voltages will be referred to as a threshold voltage VT hereinafter.

The diode-coupled transistors 1600, 1606 ensure the transistors in the unit delay 604A of FIG. 16 are operated outside of a "dead zone" or "cutoff" for each transistor, which occurs when the gate of a transistor is within the threshold voltage VT of ground for NMOS transistors and within VT of VCC for PMOS transistors. When in operating in the cutoff region, each transistor has nonlinear currents and capacitances that can adversely affect performance of the unit delay 604A, particularly as the threshold voltage VT becomes a larger fraction of the supply voltage VCC, as will be appreciated by those skilled in the art. With the diode-coupled transistors 1600, 1606, the AINB signal applied to the transistor 816 is ensured to always be at least VT so that when the unit delays 604 (see FIG. 6) are changing directions, the transistor 816 in each unit delay has at least VT applied to its gate. In contrast, in the embodiment of FIG. 8, when the unit delays 604 are changing direction the transistors 816 have AINB voltage of approximately ground applied to their gates and are thus in the cutoff region. The same is true of the AINF signal and the transistors 804. Similarly, with the diode-coupled transistors 1600, 1606, the nodes 1604, 1608 never go above VCC-VT to ensure the PMOS transistors 802, 814 in each unit delay 604 never operates in the cutoff region when the unit delay is changing directions. In contrast, in the embodiment of FIG. 8, when the unit delays 604 are changing direction the transistors 802, 814 have a voltage of approximately VCC on both gate and source and thus operate in the cutoff region.

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A synchronous mirror delay, comprising:
a model delay line for receiving an input clock signal and operable to generate a model delayed clock signal in response to the input clock signal, the model delayed clock signal having a model delay relative to the input clock signal;
a bi-directional delay line coupled to the model delay line and including a plurality of unit delays, the bi-directional delay line operable in a forward mode responsive to a mode control signal to propagate the model delayed clock signal through the unit delays in a forward direction, each unit delay delaying the model delayed clock signal by a corresponding delay, and operable in a backward mode responsive to the mode control signal to propagate the model delayed clock signal through the unit delays in a backward direction, each unit delay delaying the model delayed clock signal by the corresponding delay; and
a control circuit coupled to the bi-directional delay line, the control circuit operable to alternately place the delay line in the forward and backward modes of operation to time a forward delay, and thereafter operable to alternately place the bi-directional delay line in the forward and backward modes to time a backward delay that is approximately equal to the forward delay, and the control circuit operable upon expiration of the backward delay to output the model delayed clock signal from a selected unit delay.

2. The synchronous mirror delay of claim 1 wherein the control circuit alternately places the bi-directional delay line in the forward and backward modes responsive to the applied clock signal and the location of the model delayed clock signal as the model delayed clock signal propagates through the unit delays.

3. The synchronous mirror delay of claim 2 wherein first and second transitions of the applied clock signal are applied to the model delay line, and wherein the control circuit changes the mode of the bi-directional delay line from the forward mode to the backward mode responsive to the model delayed clock signal being located in a last unit delay and changes the mode of the bi-directional delay line from the backward mode to the forward mode responsive to the model delayed clock signal being located in a first unit delay, and changes the mode from its current state to the opposite state in response to the second transition of the applied clock signal.

4. The synchronous mirror delay of claim 3 wherein the first and second transitions of the applied clock signal comprise a first rising edge and a subsequent rising edge of the applied clock signal, respectively.

5. The synchronous mirror delay of claim 3 wherein the control circuit includes a counter that develops a reflection count, the control circuit operable prior to the second transition of the applied clock signal to control the counter to increment the reflection count from an initial value each time the model delayed clock signal is located in the first unit delay during the backward mode, and operable after the second transition of the applied clock signal to control the counter to decrement the reflection count each time the model delayed clock signal is located in the first unit delay during the backward mode, and the control circuit operable to output the model delayed clock signal from the first unit delay during the backward mode when the reflection count has been decremented to the initial value.

6. The synchronous mirror delay of claim 1 wherein each unit delay comprises:
a first logic circuit coupled to receive a forward input signal, a forward mode signal, and a backward mode signal, and having a forward output node, and being operable in response to the forward input signal to charge and discharge the forward output node at a rate determined by a value of a bias current; and
a second logic circuit coupled to receive a backward input signal, a forward mode signal, and a backward mode signal, and having a backward output node, and being operable in response to the backward input signal to charge and discharge the backward output node at the rate determined by the value of the bias current.

7. The synchronous mirror delay of claim 6 wherein the first and second logic circuits comprise:
a first bias circuit having a first signal terminal coupled to a supply voltage source and having a second signal terminal, the first bias circuit operable to provide a bias current from the second signal terminal;

a second bias transistor having a first signal terminal coupled to a reference voltage source and having a second signal terminal, the second bias circuit operable to provide the bias current from the second signal terminal;

a first switching circuit having first and second signal terminals coupled between the second signal terminal of the first bias circuit and the backward output node and having a first input coupled to receive the forward mode signal and a second input coupled to the forward output node, the first switching circuit operable to apply the bias current from the first bias circuit to charge the backward output node responsive to the forward mode signal and forward output signal on the forward output node;

a second switching circuit having first and second signal terminals coupled between the second signal terminal of the first bias circuit and the forward output node and having a first input coupled to receive the backward mode signal and a second input coupled to the backward output node, the second switching circuit operable to apply the bias current from the first bias circuit to charge the forward output node responsive to the backward mode signal and a backward output signal on the backward output node;

a third switching circuit having first and second signal terminals coupled between the second signal terminal of the second bias circuit and the backward output node and having a first input coupled to receive the forward mode signal and a second input coupled to receive the forward input signal, the third switching circuit operable to sink the bias current from the backward output node to discharge the backward output node responsive to the forward mode signal and the forward input signal; and a fourth switching circuit having first and second signal terminals coupled between the second signal terminal of the second bias circuit and the forward output node and having a first input coupled to receive the backward mode signal and a second input coupled to receive the backward input signal, the fourth switching circuit operable to sink the bias current from the forward output node to discharge the forward output node responsive to the backward mode signal and the backward input signal.

8. The synchronous mirror delay of claim 7 wherein the first bias circuit comprises a PMOS transistor for receiving a first bias voltage on its gate, and wherein the second bias circuit comprises an NMOS transistor for receiving a second bias voltage on its gate.

9. The synchronous mirror delay of claim 7 wherein the first switching circuit comprises first and second series connected PMOS transistors, the first PMOS transistor having a gate coupled to receive the forward mode signal and the second PMOS transistor having a gate coupled to the forward output node, and wherein the second switching circuit comprises first and second series connected PMOS transistors, the first PMOS transistor having a gate coupled to receive the backward mode signal and the second PMOS transistor having a gate coupled to the backward output node.

10. The synchronous mirror delay of claim 7 wherein the third switching circuit comprises first and second series connected NMOS transistors, the first NMOS transistor having a gate coupled to receive the forward mode signal and the second PMOS transistor having a gate coupled to receive the forward input signal, and wherein the fourth switching circuit comprises first and second series connected NMOS transistors, the first NMOS transistor having a gate coupled to receive the backward mode signal and the second NMOS transistor having a gate coupled to receive the backward input signal.

11. A synchronous mirror delay including a model delay line that is coupled to a bi-directional delay line, the synchronous mirror delay operable to apply an initial edge an input clock signal through the model delay line to the bi-directional delay line, and thereafter operable in a forward delay mode to alternately operate the bi-directional delay line in a forward mode and a backward mode to propagate the initial edge of the input clock signal through the bi-directional delay line and delay the initial edge of the input clock signal by a forward delay, and operable in a backward delay mode in response to a subsequent edge of the input clock signal to mirror the propagation of the input clock signal through the bi-directional delay line during the forward mode and further delay the initial edge of the input clock signal by a backward delay that is substantially equal to the forward delay.

12. The synchronous mirror delay of claim 11 wherein the initial edge of the input clock signal comprises an initial rising edge of the input clock signal and the subsequent edge of the input clock signal comprises the next rising edge of the input clock signal.

13. The synchronous mirror delay of claim 11 further comprising an input buffer coupled to the model delay line and an output circuit coupled to the bi-directional delay line, wherein the input buffer receives an initial edge of an external clock signal and generates the initial edge of the input clock signal in response to the external clock signal, and wherein the output circuit generates an edge of a synchronized clock signal in response to the initial edge of the input clock signal having the forward plus backward delays.

14. The synchronous mirror delay of claim 13 wherein the input buffer delays the initial edge of the input clock signal by a first delay relative to the initial edge of the external clock signal, and wherein the output circuit delays the edge of the synchronized clock signal by a second delay relative to the initial edge of the input clock signal having the forward plus backward delays.

15. The synchronous mirror delay of claim 14 wherein the model delay line delays the initial edge of the input clock signal by approximately the first and second delays.

16. The synchronous mirror delay of claim 13 wherein the output circuit comprises an AND gate having an output coupled to an input of an output buffer and having an input coupled to the bi-directional delay line to receive the initial edge of the input clock signal having the forward plus backward delays.

17. A synchronous mirror delay, comprising:
an input buffer for receiving an applied clock signal and operable to generate an input clock signal in response to the applied clock signal;
a model delay line coupled to the input buffer to receive the input clock signal and operable to generate a model delayed clock signal in response to the input clock signal, the model delayed clock signal having a model delay relative to the input clock signal;
a bi-directional delay line coupled to the model delay line and including a plurality of unit delays, the bi-directional delay line operable in a forward mode responsive to a mode control signal to propagate the model delayed clock signal through the unit delays in a forward direction, each unit delay delaying the model delayed clock signal by a corresponding delay, and operable in a backward mode responsive to the mode control signal to propagate the model delayed clock signal through the unit delays in a backward direction, each unit delay delaying the model delayed clock signal by the corresponding delay;

a control circuit coupled to the bi-directional delay line, the control circuit operable to alternately place the delay line in the forward and backward modes of operation to time a forward delay, and thereafter operable to alternately place the bi-directional delay line in the forward and backward modes to time a backward delay that is approximately equal to the forward delay, and the control circuit operable upon expiration of the backward delay to output the model delayed clock signal from a selected unit delay; and an output circuit coupled to bi-directional delay line to receive the output model delayed clock signal and operable in response to the output model delayed clock signal to generate a synchronized clock signal having an edge that is synchronized with a corresponding edge of the applied clock signal.

18. The synchronous mirror delay of claim 17 wherein the output circuit comprises:

an AND gate having a first input coupled to receive an enable signal from the control circuit and having a second input coupled to receive the output model delayed clock signal, and having an output that develops a delayed clock signal responsive to the enable and output model delayed clock signals; and an output buffer coupled to the output of the AND gate and operable to generate the synchronized clock signal responsive to the delayed clock signal.

19. The synchronous mirror delay of claim 17 wherein the control circuit alternately places the bi-directional delay line in the forward and backward modes responsive to the input clock signal and the location of the model delayed clock signal as the model delayed clock signal propagates through the unit delays.

20. The synchronous mirror delay of claim 19 wherein first and second transitions of the applied clock signal are applied to the model delay line, and wherein and the control circuit changes the mode of the bi-directional delay line from the forward mode to the backward mode responsive to the model delayed clock signal being located in a last unit delay and changes the mode of the bi-directional delay line from the backward mode to the forward mode responsive to the model delayed clock signal being located in a first unit delay, and changes the mode from its current state to the opposite state in response to the second transition of the applied clock signal.

21. The synchronous mirror delay of claim 20 wherein the first and second transitions of the applied clock signal comprise a first rising edge and a subsequent rising edge of the applied clock signal, respectively.

22. The synchronous mirror delay of claim 20 wherein the control circuit includes a counter that develops a reflection count, the control circuit operable prior to, the second transition of the applied clock signal to control the counter to increment the reflection count from an initial value each time the model delayed clock signal is located in the first unit delay during the backward mode, and operable after the second transition of the applied clock signal to control the counter to decrement the reflection count each time the model delayed clock signal is located in the first unit delay during the backward mode, and the control circuit operable to output the model delayed clock signal from the first unit delay during the backward mode when the reflection count has been decremented to the initial value.

23. The synchronous mirror delay of claim 17 wherein each unit delay comprises:

a first logic circuit coupled to receive a forward input signal, a forward mode signal, and a backward mode signal, and having a forward output node, and being operable in response to the forward input signal to charge and discharge the forward output node at a rate determined by a value of a bias current; and a second logic circuit coupled to receive a backward input signal, a forward mode signal, and a backward mode signal, and having a backward output node, and being operable in response to the backward input signal to charge and discharge the backward output node at the rate determined by the value of the bias current.

24. The synchronous mirror delay of claim 23 wherein the first and second logic circuits comprise:

a first bias circuit having a first signal terminal coupled to a supply voltage source and having a second signal terminal, the first bias circuit operable to provide a bias current from the second signal terminal;

a second bias circuit having a first signal terminal coupled to a reference voltage source and having a second signal terminal, the second bias circuit operable to provide the bias current from the second signal terminal;

a first switching circuit having first and second signal terminals coupled between the second signal terminal of the first bias circuit and the backward output node and having a first input coupled to receive the forward mode signal and a second input coupled to the forward output node, the first switching circuit operable to apply the bias current from the first bias circuit to charge the backward output node responsive to the forward mode signal and forward output signal on the forward output node;

a second switching circuit having first and second signal terminals coupled between the second signal terminal of the first bias circuit and the forward output node and having a first input coupled to receive the backward mode signal and a second input coupled to the backward output node, the second switching circuit operable to apply the bias current from the first bias circuit to charge the forward output node responsive to the backward mode signal and a backward output signal on the backward output node;

a third switching circuit having first and second signal terminals coupled between the second signal terminal of the second bias circuit and the backward output node and having a first input coupled to receive the forward mode signal and a second input coupled to receive the forward input signal, the third switching circuit operable to sink the bias current from the backward output node to discharge the backward output node responsive to the forward mode signal and the forward input signal; and a fourth switching circuit having first and second signal terminals coupled between the second signal terminal of the second bias circuit and the forward output node and having a first input coupled to receive the backward mode signal and a second input coupled to receive the backward input signal, the fourth switching circuit operable to sink the bias current from the forward output node to discharge the forward output node responsive to the backward mode signal and the backward input signal.

25. The synchronous mirror delay of claim 24 wherein the first bias circuit comprises a PMOS transistor coupled to receive a first bias voltage on its gate, and wherein the second bias circuit comprises an NMOS transistor coupled to receive a second bias voltage on its gate.

26. The synchronous mirror delay of claim 24 wherein the first switching circuit comprises first and second series connected PMOS transistors, the first PMOS transistor having a gate coupled to receive the forward mode signal and the second PMOS transistor having a gate coupled to the forward output node, and wherein the second switching circuit comprises first and second series connected PMOS transistors, the first PMOS transistor having a gate coupled to receive the backward mode signal and the second PMOS transistor having a gate coupled to the backward output node.

27. The synchronous mirror delay of claim 24 wherein the third switching circuit comprises first and second series connected NMOS transistors, the first NMOS transistor having a gate coupled to receive the forward mode signal and the second. PMOS transistor having a gate coupled to receive the forward input signal, and wherein the fourth switching circuit comprises first and second series connected NMOS transistors, the first NMOS transistor having a gate coupled to receive the backward mode signal and the second NMOS transistor having a gate coupled to receive the backward input signal.

28. The synchronous mirror delay of claim 24 further comprising a first level shifting circuit coupled between the backward output node and the third switching circuit and a second level shifting circuit coupled between the forward output node and the fourth switching circuit.

29. The synchronous mirror delay of claim 28 wherein the first and second level shifting circuits each comprise a diode-coupled transistor.

30. A synchronous mirror delay, comprising:
   a first input buffer for receiving an applied clock signal and operable to generate a buffered clock signal in response to the applied clock signal;
   a first model delay line coupled to the first input buffer to receive the buffered clock signal and operable to generate an input clock signal in response to the buffered clock signal, the input clock signal having a model delay relative to the buffered clock signal;
   a first bi-directional delay line coupled to the first model delay line, the first bi-directional delay line operable to alternately operate in a forward mode and a backward mode to propagate a first edge of the input clock signal through the bi-directional delay line and delay the first edge of the input clock signal by a forward delay, and operable in a backward delay mode in response to a subsequent first edge of the input clock signal to mirror the propagation of the input clock signal through the bi-directional delay line during the forward mode and further delay the first edge of the input clock signal by a backward delay that is substantially equal to the forward delay, and operable to output the first edge of the input clock signal having the forward plus backward delay;
   a second bi-directional delay line coupled to the first model delay line, the second bi-directional delay line operable to alternately operate in a forward mode and a backward mode to propagate a second edge of the input clock signal through the bi-directional delay line and delay the second edge of the input clock signal by a forward delay, and operable in a backward delay mode in response to a subsequent second edge of the input clock signal to mirror the propagation of the input clock signal through the bi-directional delay line during the forward mode and further delay the second edge of the input clock signal by a backward delay that is substantially equal to the forward delay, and operable to output the second edge of the input clock signal having the forward plus backward delay;
   a second input buffer for receiving a complementary applied clock signal and operable to generate a complementary buffered clock signal in response to the complementary applied clock signal;
   a second model delay line coupled to the second input buffer to receive the complementary buffered clock signal and operable to generate a complementary input clock signal in response to the complementary buffered clock signal, the complementary input clock signal having a model delay relative to the complementary buffered clock signal;
   a third bi-directional delay line coupled to the second model delay line, the third bi-directional delay line operable to alternately operate in a forward mode and a backward mode to propagate a first edge of the complementary input clock signal through the bi-directional delay line and delay the first edge of the complementary input clock signal by a forward delay, and operable in a backward delay mode in response to a subsequent first edge of the input clock signal to mirror the propagation of the complementary input clock signal through the bi-directional delay line during the forward ode and further delay the first edge of the complementary input clock signal by a backward delay that is substantially equal to the forward delay, and operable to output the first edge of the complementary input clock signal having the forward plus the backward delay;
   a fourth bi-directional delay line coupled to the second model delay line, the fourth bi-directional delay line operable to alternately operate in a forward mode and a backward mode to propagate a second edge of the complementary input clock signal through the bi-directional delay line and delay the second edge of the complementary input clock signal by a forward delay, and operable in a backward delay mode in response to a subsequent second edge of the complementary input clock signal to mirror the propagation of the complementary input clock signal through the bi-directional delay line during the forward mode and further delay the second edge of the complementary input clock signal by a backward delay that is substantially equal to the forward delay, and operable to output the second edge of the complementary input clock signal having the forward plus the backward delay; and
   an output circuit coupled to the first, second, third, and fourth bi-directional delay lines, the output circuit operable in response to the first and second edges of the input clock signal having the forward plus backward delay and the first and second edges of the complementary input clock signal having the forward plus backward delay to generate a synchronized clock signal having rising and falling edges that are synchronized with rising and falling edges of the applied clock signal.

31. The synchronous mirror delay of claim 30 wherein the first edge of the input clock signal comprises an even rising edge of the input clock signal and the subsequent first edge of the input clock signal comprises the next even rising edge of the input clock signal, and wherein the second edge of the input clock signal comprises an odd rising edge of the input clock signal and the subsequent second edge of the input clock signal comprises the next odd rising edge of the input clock signal, and wherein the first edge of the complementary input clock signal comprises an even rising edge of the complementary input clock signal and the subsequent first edge of the complementary input clock signal comprises the next even rising edge of the complementary input clock signal, and wherein the second edge of the complementary input clock signal comprises an odd rising edge of the complementary input clock signal and the subsequent second edge of the complementary input clock signal comprises the next odd rising edge of the complementary input clock signal.

32. The synchronous mirror delay of claim 30 wherein the output circuit comprises:
   a first OR gate coupled to the first and second bi-directional delay lines;
   a second OR gate coupled to the third and fourth bi-directional delay lines:
   an RS flip-flop having a set input coupled to an output of the first OR gate and a reset input coupled to an output of the second OR gate, and generating a delayed clock signal responsive to the outputs from the first and second OR gates; and
   an output buffer coupled to the RS flip-flop to receive the delayed clock signal and operable in response to the delayed clock signal to generate the synchronized clock signal.

33. The synchronous mirror delay of claim 30 wherein each bi-directional delay line comprises a plurality of unit delay, each unit delay comprising:
   a first logic circuit coupled to receive a forward input signal, a forward mode signal, and a backward mode signal, and having a forward output node, and being operable in response to the forward input signal to charge and discharge the forward output node at a rate determined by a value of a bias current; and
   a second logic circuit coupled to receive a backward input signal, the forward mode signal, and the backward mode signal, and having a backward output node, and being operable in response to the backward input signal to charge and discharge the backward output node at the rate determined by the value of the bias current.

34. The synchronous mirror delay of claim 33 wherein the first and second logic circuits comprise:
   a first bias circuit having a first signal terminal coupled to a supply voltage source and having a second signal terminal, the first bias circuit operable to provide a bias current from the second signal terminal;
   a second bias transistor having a first signal terminal coupled to a reference voltage source and having a second signal terminal, the second bias circuit operable to provide the bias current from the second signal terminal;
   a first switching circuit having first and second signal terminals coupled between the second signal terminal of the first bias circuit and the backward output node and having a first input coupled to receive the forward mode signal and a second input coupled to the forward output node, the first switching circuit operable to apply the bias current from the first bias circuit to charge the backward output node responsive to the forward mode signal and forward output signal on the forward output node;
   a second switching circuit having first and second signal terminals coupled between the second signal terminal of the first bias circuit and the forward output node and having a first input coupled to receive the backward mode signal and a second input coupled to the backward output node, the second switching circuit operable to apply the bias current from the first bias circuit to charge the forward output node responsive to the backward mode signal and a backward output signal on the backward output node;
   a third switching circuit having first and second signal terminals coupled between the second signal terminal of the second bias circuit and the backward output node and having a first input coupled to receive the forward mode signal and a second input coupled to receive the forward input signal, the third switching circuit operable to sink the bias current from the backward output node to discharge the backward output node responsive to the forward mode signal and the forward input signal; and
   a fourth switching circuit having first and second signal terminals coupled between the second signal terminal of the second bias circuit and the forward output node and having a first input coupled to receive the backward mode signal and a second input coupled to receive the backward input signal, the fourth switching circuit operable to sink the bias current from the forward output node to discharge the forward output node responsive to the backward mode signal and the backward input signal.

35. The synchronous mirror delay of claim 34 wherein the first bias circuit comprises a PMOS transistor coupled to receive a first bias voltage on its gate, and wherein the second bias circuit comprises an NMOS transistor coupled to receive a second bias voltage on its gate.

36. The synchronous mirror delay of claim 34 wherein the first switching circuit comprises first and second series connected PMOS transistors, the first PMOS transistor having a gate coupled to receive the forward mode signal and the second PMOS transistor having a gate coupled to the forward output node, and wherein the second switching circuit comprises first and second series connected PMOS transistors, the first PMOS transistor having a gate coupled to receive the backward mode signal and the second PMOS transistor having a gate coupled to the backward output node.

37. The synchronous mirror delay of claim 34 wherein the third switching circuit comprises first and second series connected NMOS transistors, the first NMOS transistor having a gate coupled to receive the forward mode signal and the second PMOS transistor having a gate coupled to receive the forward input signal, and wherein the fourth switching circuit comprises first and second series connected NMOS transistors, the first NMOS transistor having a gate coupled to receive the backward mode signal and the second NMOS transistor having a gate coupled to receive the backward input signal.

38. A memory device, comprising:
   an address bus;
   a control bus;
   a data bus;
   an address decoder coupled to the address bus;
   a read/write circuit coupled to the data bus;
   a first control circuit coupled to the control bus;
   a memory-cell array coupled to the address decoder, the first control circuit, and read/write circuit;
   a synchronous mirror delay coupled to at least the first control circuit and for receiving an input clock signal, the synchronous mirror delay operable to generate a delayed clock signal and the first control circuit generating control signals in response to the delayed clock signal, the synchronous mirror delay comprising,
      a model delay line for receiving the input clock signal and operable to generate a model delayed clock signal in response to the input clock signal, the model delayed clock signal having a model delay relative to the input clock signal;

a bi-directional delay line coupled to the model delay line and including a plurality of unit delays, the bi-directional delay line operable in a forward mode responsive to a mode control signal to propagate the model delayed clock signal through the unit delays in a forward direction, each unit delay delaying the model delayed clock signal by a corresponding delay, and operable in a backward mode responsive to the mode control signal to propagate the model delayed clock signal through the unit delays in a backward direction, each unit delay delaying the model delayed clock signal by the corresponding delay; and a second control circuit coupled to the bi-directional delay line, the second control circuit operable to alternately place the delay line in the forward and backward modes of operation to time a forward delay, and thereafter operable to alternately place the bi-directional delay line in the forward and backward modes to time a backward delay that is approximately equal to the forward delay, and the second control circuit operable upon expiration of the backward delay to output the model delayed clock signal from a selected unit delay as the delayed clock signal.

39. The memory device of claim 38 wherein the memory device comprises a DDR DRAM.

40. The memory device of claim 38 wherein the delayed clock signal is applied to clock an output driver coupled to the data bus.

41. A computer system, comprising:
   a data input device;
   a data output device;
   a processor coupled to the data input and output devices; and
   a memory device coupled to the processor, the memory device comprising,
      an address bus;
      a control bus;
      a data bus;
      an address decoder coupled to the address bus;
      a read/write circuit coupled to the data bus;
      a first control circuit coupled to the control bus;
      a memory-cell array coupled to the address decoder, the first control circuit, and read/write circuit;
      a synchronous mirror delay coupled to at least the first control circuit and for receiving an input clock signal, the synchronous mirror delay operable to generate a delayed clock signal and the first control circuit generating control signals in response to the delayed clock signal, the synchronous mirror delay comprising,
         a model delay line for receiving the input clock signal and operable to generate a model delayed clock signal in response to the input clock signal, the model delayed clock signal having a model delay relative to the input clock signal;
         a bi-directional delay line coupled to the model delay line and including a plurality of unit delays, the bi-directional delay line operable in a forward mode responsive to a mode control signal to propagate the model delayed clock signal through the unit delays in a forward direction, each unit delay delaying the model delayed clock signal by a corresponding delay, and operable in a backward mode responsive to the mode control signal to propagate the model delayed clock signal through the unit delays in a backward direction, each unit delay delaying the model delayed clock signal by the corresponding delay; and
         a second control circuit coupled to the bi-directional delay line, the second control circuit operable to alternately place the delay line in the forward and backward modes of operation to time a forward delay, and thereafter operable to alternately place the bi-directional delay line in the forward and backward modes to time a backward delay that is approximately equal to the forward delay, and the control circuit operable upon expiration of the backward delay to output the model delayed clock signal from a selected unit delay as the delayed clock signal.

42. The memory device of claim 41 wherein the memory device comprises a DDR DRAM.

43. The memory device of claim 42 wherein the delayed clock signal is applied to clock an output driver coupled to the data bus.

44. A method for controlling a bi-directional delay line to generate a delayed clock signal having a delay relative to an applied clock signal, the method comprising:
   receiving an initial edge of the applied clock signal;
   applying the initial edge of the applied clock signal to the bi-directional delay line;
   alternately placing the bi-directional delay line in forward and backward delay modes of operation to generate a forward delay of the initial edge of the applied clock signal;
   in response to a subsequent edge of the applied clock signal, alternately placing the bi-directional in forward and backward delay modes of operation to generate a backward delay of the initial edge of the applied clock signal; and
   generating an edge of the delayed clock signal having a delay of the forward plus the backward delay relative to the initial edge of the applied clock signal.

45. The method of claim 44 wherein the initial edge of the applied clock signal comprises a rising edge and the subsequent edge of the applied clock signal comprises the next rising edge.

46. A method for generating a delayed clock signal having a delay relative to an applied clock signal, the method comprising:
   receiving an initial edge of the applied clock signal;
   timing a forward delay by propagating the initial edge of the applied clock signal through a plurality of series connected bi-directional unit delays in a forward and a backward direction;
   in response to a subsequent edge of the applied clock signal, timing a backward delay by propagating the initial edge of the applied clock signal through the plurality of series connected bi-directional unit delays in forward and backward directions to generate a backward delay of the initial edge of the applied clock signal that is substantially equal to the forward delay; and
   generating an edge of the delayed clock signal having a delay of the forward plus the backward delay relative to the initial edge of the applied clock signal.

47. The method of claim 46 wherein the initial edge of the applied clock signal comprises a rising edge and the subsequent edge of the applied clock signal comprises the next rising edge.

48. The method of claim 46 wherein the initial edge of the applied clock signal comprises an initial rising edge and the subsequent edge of the applied clock signal comprises the a second rising edge after the initial rising edge.

* * * * *

UNITED STATES PATENT AND TRADEMARK OFFICE
CERTIFICATE OF CORRECTION

PATENT NO.      : 6,621,316 B1
DATED           : September 16, 2003
INVENTOR(S)     : Howard C. Kirsch It is certified that error appears in the above-identified patent and that said Letters Patent is hereby corrected as shown below:

Title page,
Item [56], References Cited, OTHER PUBLICATIONS,
"Kim" reference, reads "Patent Application Publication, 0180499, Kim et a Dec. 2, 2002.*" should read -- Patent Application Publication, 0180499, Kim et al., Dec. 2, 2002.* --
"Jang" reference, reads "Jang, Seong-Jin et al., A Compact Ring Delay Line for High Speed Synchronous DRAM, IEEE Symposium" should read -- Jang, Seong-Jin et al., reads "A Compact Ring Delay Line for High Speed Synchronous DRAM," IEEE Symposium --
"Kuge" reference, reads "Post Mold-Tuning Method" should read -- Post-Mold-Tuning Method --
"Takai" reference, reads "Takai, Yasuhiro et al., A 250Mb/s/pin 1Gb Double Data Rate SDRAM with a Bi-Directional Delay and an Inter-Bank Shared Redundancy Scheme, 1999." should read -- Takai, Yasuhiro et al., reads "A 250Mb/s/pin 1Gb Double Data Rate SDRAM with a Bi-Directional Delay and an Inter-Bank Shared Redundancy Scheme, 1999. --
Item [57], ABSTRACT,
Line 1, reads "delay (SMD)includes" should read -- delay (SMD) includes --
Line 3, reads "an initial edge an input" should read -- an initial edge of an input --
Line 13, reads "and further delay the initial" should read -- and further delays the initial --

Column 2,
Line 59, reads "in the-backward delay" should read -- in the backward delay --

Column 5,
Line 33, reads "410-416 the connected" should read -- 410-416 connected --

Column 7,
Line 39, reads "which turns turn ON" should read -- which turns ON --

Column 9,
Line 15, reads "delay (SMD)includes" should read -- delay (SMD) includes --
Line 17, reads "edge an input clock" should read -- edge of an input clock --
Line 27, reads "and further delay" should read -- and further delays --

Column 10,
Line 66, reads "output signals HOUTF" should read -- output signal HOUTF --

Column 11,
Line 18, reads "by a delay D0" should read -- by a delay DO --
Line 51, reads "signal from the" should read -- from the --

UNITED STATES PATENT AND TRADEMARK OFFICE
CERTIFICATE OF CORRECTION

PATENT NO.   : 6,621,316 B1
DATED        : September 16, 2003
INVENTOR(S)  : Howard C. Kirsch It is certified that error appears in the above-identified patent and that said Letters Patent is hereby corrected as shown below:

Column 12,
Line 2, reads "once again and" should read -- once again --
Line 27, reads "to the N+⊕" should read -- to the N+1 --
Line 57, reads "once again and placing" should read -- once again placing --

Column 13,
Line 64, reads "602 all identical," should read -- 602 are identical, --

Column 16,
Lines 21 and 26, reads "gates operating combination" should read -- gates operate in combination --
Line 47, reads "transistor 1006 as the same" should read -- transistor 1006 has the same --

Column 17,
Line 40, reads "including he SMD" should read -- including the SMD --

Column 18,
Line 50, reads "N/2 bits words" should read -- N/2 bit words --

Column 21,
Line 18, reads "generating CLKDELR2" should read -- generating the CLKDELR2 --
Line 52, reads "generating CLKDELF1" should read -- generating the CLKDELF1 --

Column 22,
Line 27, reads "edge being delay." should read -- edge being delayed. --
Line 41, reads "equal to period" should read -- equal to the period --
Line 43, reads "be provide to increase" should read -- be provided to increase --
Line 49, reads "operates in an manner" should read -- operates in a manner --
Line 60, reads "delay a respective" should read -- delayed a respective --

Column 23,
Line 17, reads "When in operating" should read -- When operating --
Line 35, reads "operates in the cutoff" should read -- operate in the cutoff --

Column 26,
Line 8, reads "an initial edge an" should read -- an initial edge of an --

UNITED STATES PATENT AND TRADEMARK OFFICE
CERTIFICATE OF CORRECTION

PATENT NO. : 6,621,316 B1
DATED : September 16, 2003
INVENTOR(S) : Howard C. Kirsch It is certified that error appears in the above-identified patent and that said Letters Patent is hereby corrected as shown below:

Column 27,
Line 42, reads "wherein and the control" should read -- wherein the control --
Line 57, reads "prior to, the second" should read -- prior to the second --

Column 29,
Line 18, reads "second. PMOS transistor" should read -- second PMOS transistor --

Column 30,
Line 27, reads "the forward ode and further" should read -- the forward mode and further --

Column 31,
Line 34, reads "a backward input" should read -- the backward input --
Line 35, reads "the forward mode" should read -- a forward mode --

Column 34,
Line 9, reads "control circuit" should read -- second control circuit --
Line 64, reads "comprises the a" should read -- comprises a --

Signed and Sealed this

Fifth Day of October, 2004

JON W. DUDAS
*Director of the United States Patent and Trademark Office*

UNITED STATES PATENT AND TRADEMARK OFFICE
CERTIFICATE OF CORRECTION

PATENT NO. : 6,621,316 B1  
DATED : September 16, 2003  
INVENTOR(S) : Howard C. Kirsch It is certified that error appears in the above-identified patent and that said Letters Patent is hereby corrected as shown below:

Title page,  
Item [56], References Cited, OTHER PUBLICATIONS,  
"Kim" reference, reads "Patent Application Publication, 0180499, Kim et a Dec. 2, 2002.*" should read -- Patent Application Publication, 0180499, Kim et al., Dec. 2, 2002.* --  
"Jang" reference, reads "Jang, Seong-Jin et al., A Compact Ring Delay Line for High Speed Synchronous DRAM, IEEE Symposium" should read -- Jang, Seong-Jin et al., "A Compact Ring Delay Line for High Speed Synchronous DRAM," IEEE Symposium --  
"Kuge" reference, reads "Post Mold-Tuning Method" should read -- Post-Mold-Tuning Method --  
"Takai" reference, reads "Takai, Yasuhiro et al., A 250Mb/s/pin 1Gb Double Data Rate SDRAM with a Bi-Directional Delay and an Inter-Bank Shared Redundancy Scheme, 1999." should read -- Takai, Yasuhiro et al., reads "A 250Mb/s/pin 1Gb Double Data Rate SDRAM with a Bi-Directional Delay and an Inter-Bank Shared Redundancy Scheme, 1999. --  
Item [57], ABSTRACT,  
Line 1, reads "delay (SMD)includes" should read -- delay (SMD) includes --  
Line 3, reads "an initial edge an input" should read -- an initial edge of an input --  
Line 13, reads "and further delay the initial" should read -- and further delays the initial --

Column 2,  
Line 59, reads "in the-backward delay" should read -- in the backward delay --

Column 5,  
Line 33, reads "410-416 the connected" should read -- 410-416 connected --

Column 7,  
Line 39, reads "which turns turn ON" should read -- which turns ON --

Column 9,  
Line 15, reads "delay (SMD)includes" should read -- delay (SMD) includes --  
Line 17, reads "edge an input clock" should read -- edge of an input clock --  
Line 27, reads "and further delay" should read -- and further delays --

Column 10,  
Line 66, reads "output signals HOUTF" should read -- output signal HOUTF --

Column 11,  
Line 18, reads "by a delay D0" should read -- by a delay DO --  
Line 51, reads "signal from the" should read -- from the --

UNITED STATES PATENT AND TRADEMARK OFFICE
CERTIFICATE OF CORRECTION

PATENT NO. : 6,621,316 B1
DATED : September 16, 2003
INVENTOR(S) : Howard C. Kirsch It is certified that error appears in the above-identified patent and that said Letters Patent is hereby corrected as shown below:

Column 12,
Line 2, reads "once again and" should read -- once again --
Line 27, reads "to the N+⊕" should read -- to the N+1 --
Line 57, reads "once again and placing" should read -- once again placing --

Column 13,
Line 64, reads "602 all identical," should read -- 602 are identical, --

Column 16,
Lines 21 and 26, reads "gates operating combination" should read -- gates operate in combination --
Line 47, reads "transistor 1006 as the same" should read -- transistor 1006 has the same --

Column 17,
Line 40, reads "including he SMD" should read -- including the SMD --

Column 18,
Line 50, reads "N/2 bits words" should read -- N/2 bit words --

Column 21,
Line 18, reads "generating CLKDELR2" should read -- generating the CLKDELR2 --
Line 52, reads "generating CLKDELF1" should read -- generating the CLKDELF1 --

Column 22,
Line 27, reads "edge being delay." should read -- edge being delayed. --
Line 41, reads "equal to period" should read -- equal to the period --
Line 43, reads "be provide to increase" should read -- be provided to increase --
Line 49, reads "operates in an manner" should read -- operates in a manner --
Line 60, reads "delay a respective" should read -- delayed a respective --

Column 23,
Line 17, reads "When in operating" should read -- When operating --
Line 35, reads "operates in the cutoff" should read -- operate in the cutoff --

Column 26,
Line 8, reads "an initial edge an" should read -- an initial edge of an --

UNITED STATES PATENT AND TRADEMARK OFFICE
CERTIFICATE OF CORRECTION

PATENT NO. : 6,621,316 B1
DATED : September 16, 2003
INVENTOR(S) : Howard C. Kirsch It is certified that error appears in the above-identified patent and that said Letters Patent is hereby corrected as shown below:

Column 27,
Line 42, reads "wherein and the control" should read -- wherein the control --
Line 57, reads "prior to, the second" should read -- prior to the second --

Column 29,
Line 18, reads "second. PMOS transistor" should read -- second PMOS transistor --

Column 30,
Line 27, reads "the forward ode and further" should read -- the forward mode and further --

Column 31,
Line 34, reads "a backward input" should read -- the backward input --
Line 35, reads "the forward mode" should read -- a forward mode --

Column 34,
Line 9, reads "control circuit" should read -- second control circuit --
Line 64, reads "comprises the a" should read -- comprises a --

This certificate supersedes Certificate of Correction issued October 5, 2004.

Signed and Sealed this

Twenty-ninth Day of March, 2005

JON W. DUDAS
*Director of the United States Patent and Trademark Office*